US007610991B2

(12) United States Patent
Suzuki et al.

(10) Patent No.: US 7,610,991 B2
(45) Date of Patent: Nov. 3, 2009

(54) SPEAKER AND METHOD OF OUTPUTTING ACOUSTIC SOUND

(75) Inventors: Nobukazu Suzuki, Kanagawa (JP); Masaru Uryu, Chiba (JP); Yoshio Ohashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 164 days.

(21) Appl. No.: 11/703,786

(22) Filed: Feb. 8, 2007

(65) Prior Publication Data

US 2007/0199427 A1 Aug. 30, 2007

(30) Foreign Application Priority Data

Feb. 9, 2006 (JP) .......................... P2006-032958

(51) Int. Cl.
*H05K 5/02* (2006.01)
*G10K 11/22* (2006.01)
*H04R 1/24* (2006.01)
*H04R 1/34* (2006.01)
*H05K 5/00* (2006.01)
*G10K 11/08* (2006.01)
*H04R 1/20* (2006.01)

(52) U.S. Cl. ....................... 181/153; 181/156; 181/195; 181/196; 381/338; 381/349

(58) Field of Classification Search ................. 181/153, 181/156, 144, 145, 152, 195, 196, 155, 187, 181/176, 173; 381/338, 340, 349, 335, 152, 381/432
See application file for complete search history.

(56) References Cited

U.S. PATENT DOCUMENTS 705,126 A * 7/1902 Osten et al. ................. 181/187
1,634,380 A * 7/1927 William ...................... 369/163
1,803,892 A * 5/1931 Corrigan ..................... 181/163
2,905,259 A * 9/1959 William ...................... 181/159
3,329,235 A * 7/1967 Shaper ....................... 181/147
3,393,766 A * 7/1968 Mitchell ..................... 381/300
3,945,461 A * 3/1976 Robinson .................... 181/153
4,126,204 A * 11/1978 Ogi et al. .................... 181/156
4,421,957 A * 12/1983 Wallace, Jr. ................. 381/338
4,554,414 A * 11/1985 House ........................ 381/182
5,025,886 A * 6/1991 Jung .......................... 181/156
5,111,509 A * 5/1992 Takeuchi et al. ............ 381/338
5,450,499 A * 9/1995 Morris et al. ............... 381/397
5,721,401 A * 2/1998 Sim ........................... 181/148
5,734,728 A * 3/1998 Meissner ..................... 381/89
6,021,208 A * 2/2000 Kin-Lung ................... 381/338
6,055,320 A * 4/2000 Wiener et al. ............... 381/343
6,719,091 B1 * 4/2004 Brown ........................ 181/153

(Continued)

FOREIGN PATENT DOCUMENTS

DE 3330747 A1 * 3/1985

(Continued)

*Primary Examiner*—Edgardo San Martin
(74) *Attorney, Agent, or Firm*—Finnegan, Henderson, Farabow, Garrett & Dunner, L.L.P.

(57) ABSTRACT

A speaker contains a pipe member containing opposed ends and a sounding body that is driven on the basis of an acoustic signal which is applied to the sounding body. The sounding body is arranged on the same axis as that of the pipe member. Sound wave radiated from the sounding body radiates from the opposed ends of the pipe member.

7 Claims, 26 Drawing Sheets

U.S. PATENT DOCUMENTS

| | | | | |
|---|---|---|---|---|
| 2002/0003888 | A1 * | 1/2002 | Budge | 381/345 |
| 2004/0071298 | A1 * | 4/2004 | Geeng | 381/89 |
| 2005/0105745 | A1 * | 5/2005 | Bowen et al. | 381/89 |
| 2007/0186749 | A1 * | 8/2007 | Suzuki et al. | 84/330 |
| 2007/0284184 | A1 * | 12/2007 | Krueger | 181/151 |

FOREIGN PATENT DOCUMENTS

| | | | |
|---|---|---|---|
| JP | 03204298 A | * | 9/1991 |
| JP | 05-56493 | | 3/1993 |

* cited by examiner

SPEAKER AND METHOD OF OUTPUTTING ACOUSTIC SOUND

CROSS REFERENCE TO RELATED APPLICATION

The present invention contains subject matters related to Japanese Patent Application JP 2006-032958 filed in the Japanese Patent Office on Feb. 9, 2006, the entire contents of which being incorporated herein by reference.

BACKGROUND OF THE INVENTION

1. Field of the Invention

The present invention relates to a speaker and a method of outputting acoustic sound. More particularly, it relates to a speaker and the like that radiate sound wave radiated from a sounding body to outside by using a pipe member that constitutes a resonator.

2. Description of Related Art

Japanese Patent Application Publication No. H05-56493 has disclosed an omni-directional speaker system in which a speaker unit is installed on an upper open end of a pipe member (pipe body) on the same axis as that of the pipe member.

SUMMARY OF THE INVENTION

In the above speaker system disclosed in the above Japanese Patent Application Publication No. H05-56493, a base plate is installed on a bottom open end of the pipe member. Accordingly, the speaker unit radiates sound wave from only an upper side of the pipe member. By such the radiation of sound wave, however, a listener may feel any uneven sound pressure on each position of the pipe member along a longitudinal direction thereof. This causes an acoustic image to be localized to the upper side of the pipe member. Thus, in the speaker system, it is difficult to avoid localizing the acoustic image and accomplish a wide dispersion of sound from the whole of the pipe member in the longitudinal direction thereof to spread its acoustic image to the whole of the pipe member so that a listener can get a global acoustic image on the speaker.

It is desirable to provide a speaker and a method of outputting acoustic sound that accomplish a wide dispersion of sound from the whole of the pipe member in the longitudinal direction thereof, thereby spreading its acoustic image to the whole of the pipe member to get a listener a global acoustic image on the speaker.

According to an embodiment of the present invention, there is provided a speaker including a pipe member that contains opposed ends and a sounding body that is driven on the basis of an acoustic signal which is applied to the sounding body. The sounding body is arranged on the same axis as that of the pipe member. Sound wave radiated from the sounding body radiates from the opposed ends of the pipe member.

The speaker according to an embodiment of the invention has the pipe member and the sounding body. The sounding body is arranged on the same axis as that of the pipe member. The sound wave radiated from the sounding body radiates from the opposed ends of the pipe member. For example, the sounding body includes a speaker unit in which an electrodynamic actuator is used.

Thus, such the radiation of the sound wave radiated from the sounding body from the opposed ends enables a listener to feel any even sound pressure from each position of the pipe member along a longitudinal direction thereof, thereby spreading its acoustic image to the whole of the pipe member to get the listener a global acoustic image on the speaker.

In the speaker according to the embodiment of the invention, for example, an interior of the pipe member is partitioned by a partition member into plural parts to form passages each extending along an axis direction of the pipe member. Plural sounding bodies are respectively arranged on the same axis as that of the pipe member in each of the passages. This prevents the plural sounding bodies from being interfered with each other. When the plural sounding bodies are driven on the basis of acoustic signals that are respectively separated from each other, for example, multichannel acoustic signals or acoustic signals that are acquired by adjusting an identical acoustic signal on its level, its delay time, its frequency property separately, it is possible to perform any sound field processing so as to spread its acoustic image to the whole of the pipe member to get the listener a global acoustic image on the speaker.

Further, in the speaker according to the embodiment of the invention, a part of the plural passages is formed at a central part of the pipe member and the other part of the plural passages is formed around the part of the passages formed at the central part of the pipe member. In this moment, if a sounding body corresponding to the part of the passages formed at a central part of the pipe member is driven by a first acoustic signal and a sounding body corresponding to a passage formed around the part of the passages formed at the central part of the pipe member is driven by a second acoustic signal, it is also possible to get any steady sound field control effect in any points on a circumference of the pipe member.

For example, the sounding body is arranged at a middle portion of the pipe member in a longitudinal direction thereof. This enables levels of the sound waves radiated from the opposed ends of the pipe member to be made almost identical to each other, thereby enabling a listener to feel any even sound pressure from each position of the pipe member along a longitudinal direction thereof.

Additionally, in the speaker according to the embodiment of the invention, the pipe member contains different diameters of its circular cross sections, which are gradually made larger toward a direction where the sound wave radiated from the sounding body propagates. This causes electric inductance component to be increased so as to get a flat frequency property and a resonance dumping effect. This also enables an output of the pipe member, from which the sound wave radiates, to be enlarged as compared with a pipe member having no gradually enlarged diameters of its circular cross sections, thereby enhancing the spread of acoustic image.

Further, in the speaker according to the embodiment of the invention, the sounding body includes a first sounding member and a second sounding member. First sound wave radiated from the first sounding member then radiates from an end of the pipe member to outside and second sound wave having the same phase as that of the first sound wave and being radiated from the second sounding member radiates from the other end of the pipe member to outside. This enables the opposed ends of the pipe member to have the identical property, thereby preventing the listener from feeling any difference in their properties.

According to another embodiment of the invention, there is provided a method of outputting an acoustic sound by radiating sound wave radiated from a sounding body to outside by using a pipe member that contains opposed ends. The method has the steps of arranging the sounding body on a base member on the same axis as that of the pipe member, and radiating the sound wave that has been radiated from the sounding body from the opposed ends of the pipe member to the outside.

Thus, according to this embodiment of the invention, the sound wave that has been radiated from the sounding body can radiate from the opposed ends of the pipe member to outside. This also allows the listener to feel any even sound pressure from each position of the pipe member along a longitudinal direction thereof, thereby spreading its acoustic image to the whole of the pipe member to get the listener a global acoustic image on the speaker.

The concluding portion of this specification particularly points out and directly claims the subject matter of the present invention. However, those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENTS

Figure 1:
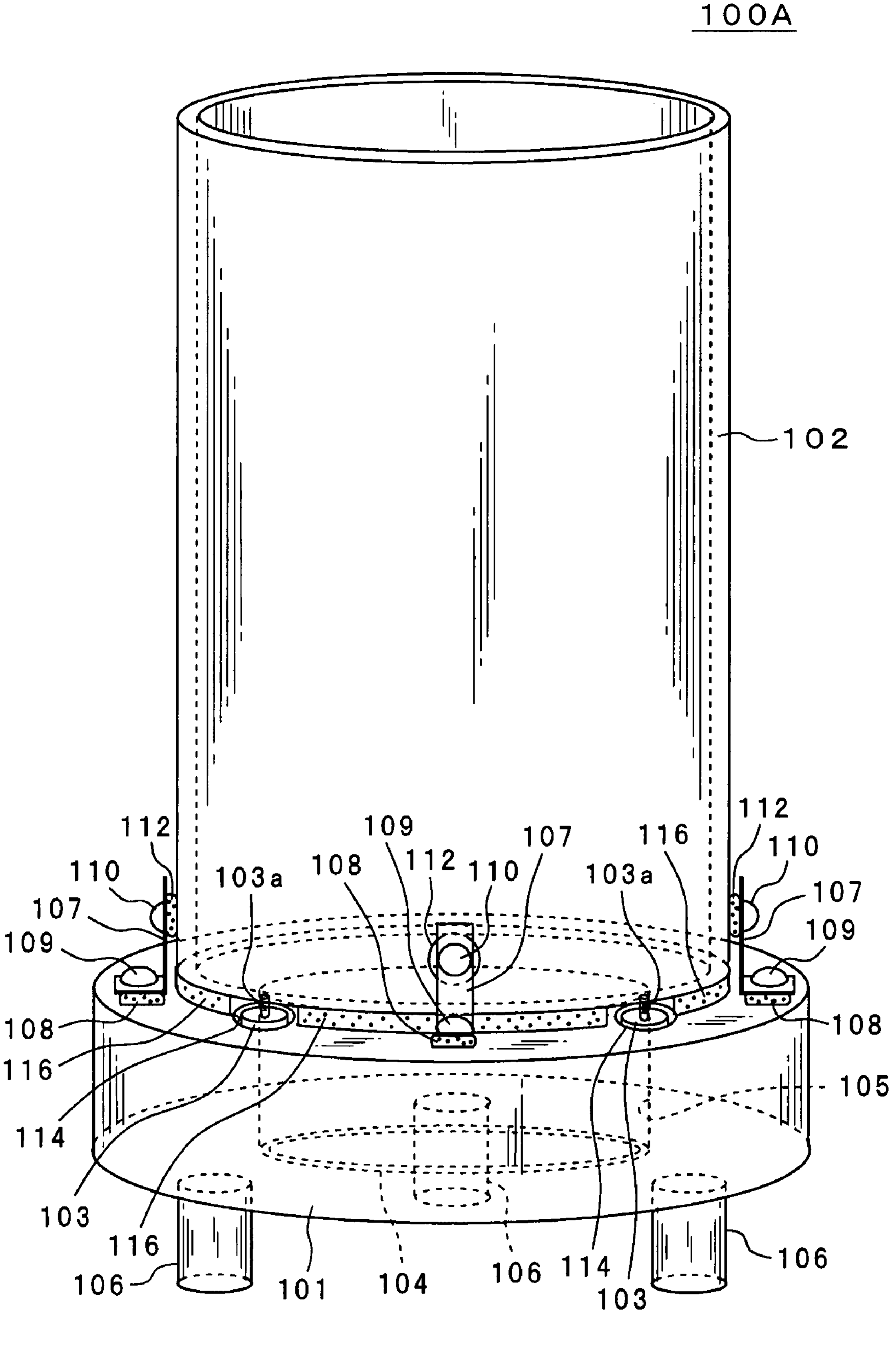
FIG. 1 is a perspective view of a speaker 100A according to an embodiment of the invention.
Figure 2:
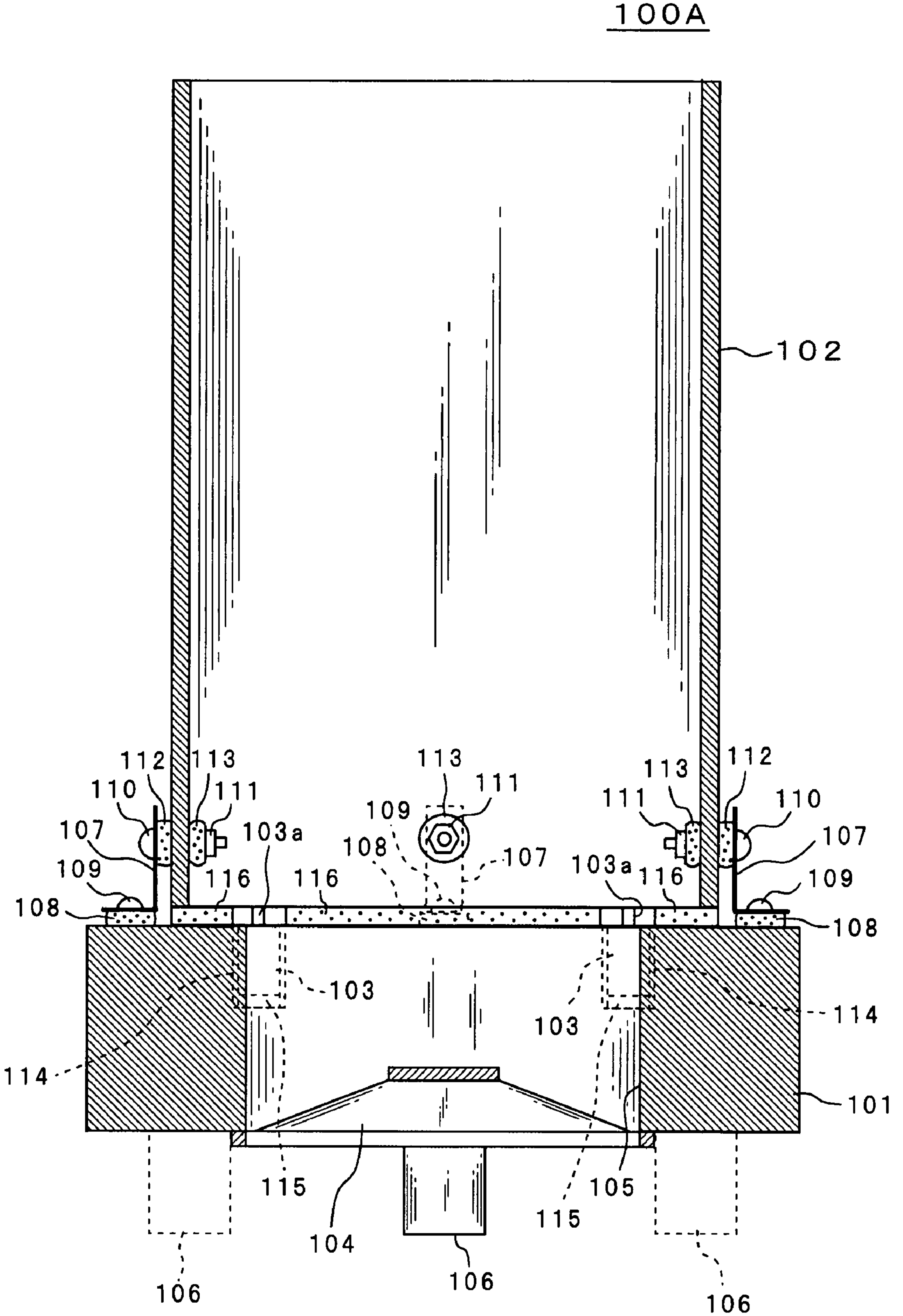
FIG. 2 is a vertical sectional view of the speaker 100A according to the embodiment of the invention.
Figure 3:
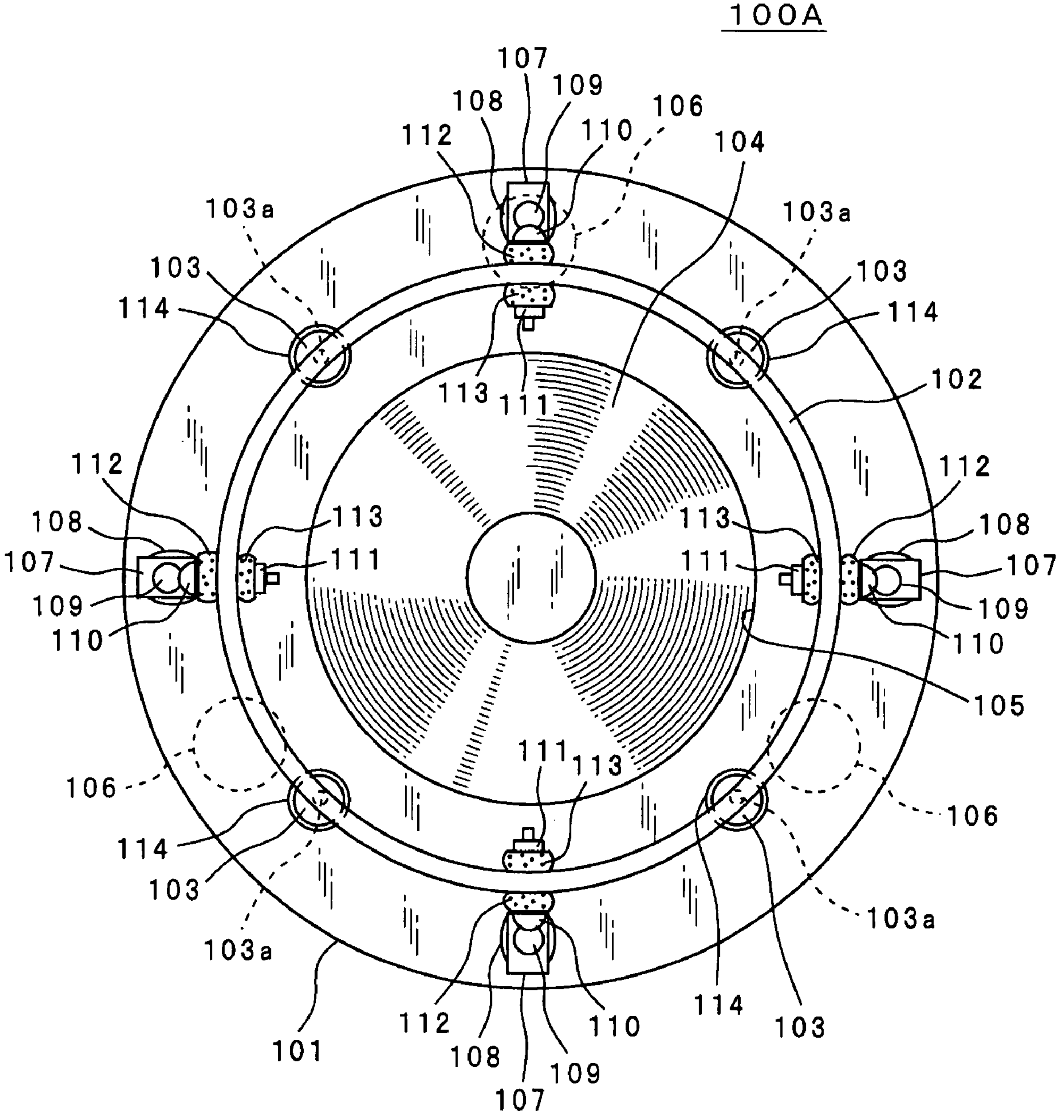
FIG. 3 is a top plan view of the speaker 100A according to the embodiment of the invention.
Figure 4:
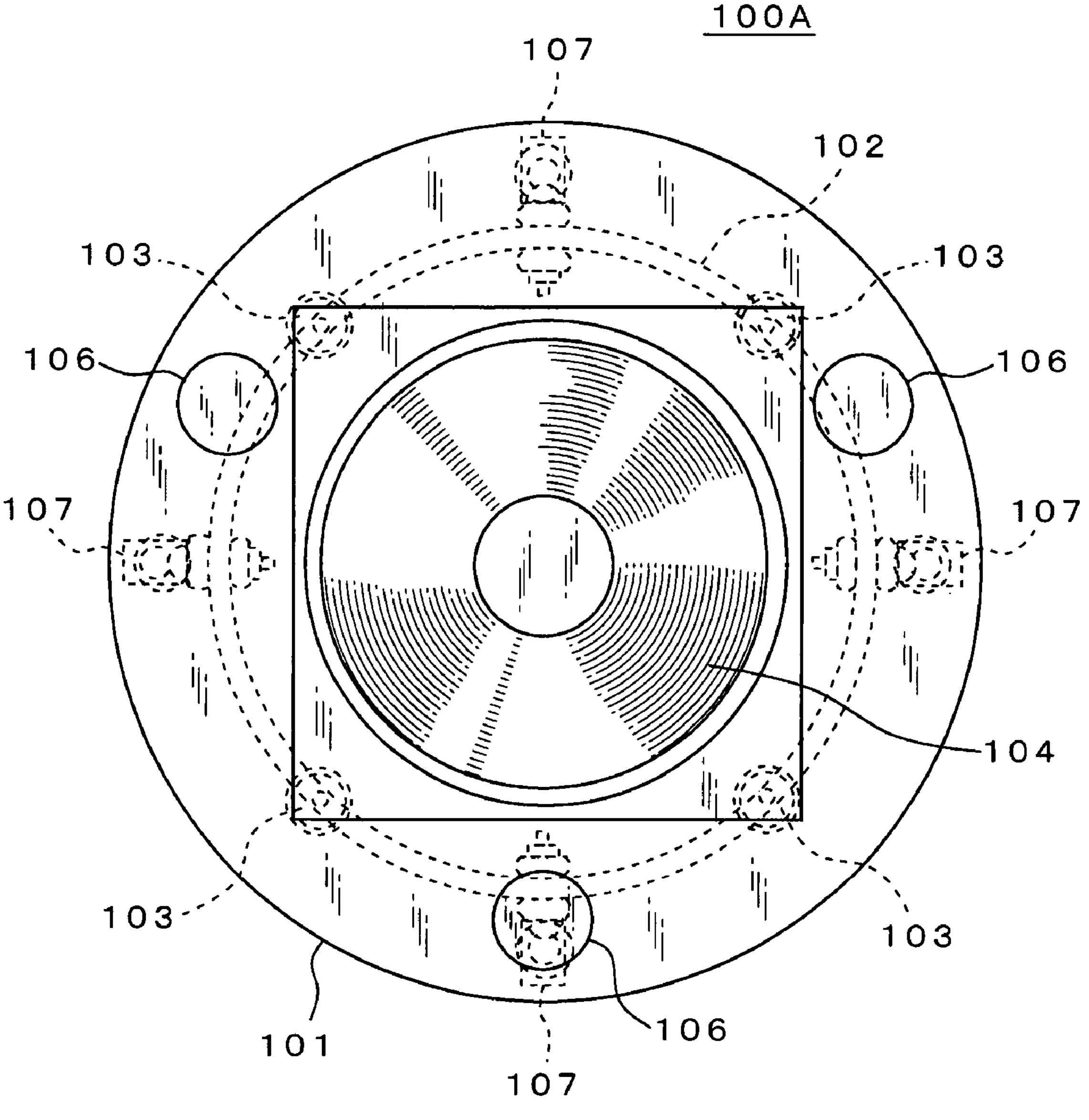
FIG. 4 is a bottom plan view of the speaker 100A according to the embodiment of the invention.

The following will describe embodiments of the present invention with reference to the accompanied drawings. FIGS. 1 through 4 show a configuration of an embodiment of a speaker 100A according to the invention. FIG. 1 is a perspective view of the speaker 100A according to the embodiment of the invention; FIG. 2 is a vertical sectional view thereof; FIG. 3 is a top plan view thereof; and FIG. 4 is a bottom plan view thereof.

The speaker 100A has a base casing 101, a pipe member 102, magnetostrictive actuators 103 as actuators, and a speaker unit 104. The pipe member 102 constitutes a diaphragm of tube as an acoustic diaphragm. A driving rod 103a of each of the magnetostrictive actuator 103 constitutes a transmission portion which transmits a displacement output of each of the magnetostrictive actuators 103. The speaker unit 104 is a sounding body in which an electrodynamic actuator is used.

The base casing 101 is made of, for example, synthetic resin. This base casing 101 has a shape like a disk as a whole and a cylindrical opening 105 passing through it at a center portion thereof. This base casing 101 also has a predetermined number of legs 106, in this embodiment, three legs, at the same distance along a lower outer circumference portion thereof.

If the base casing 101 has three legs 106, it is possible to implement a more stable setting thereof than a case where the base casing 101 has, for example, four legs because these three legs 106 may be necessarily contacted to any places to be contacted. Further, providing a bottom surface of the base casing 101 with the legs 106 enables the bottom surface thereof to be away from the places to be contacted, thereby allowing sound wave radiated from the speaker unit 104 that is provided under the base casing 101 to radiate toward outside.

The pipe member 102 is made of, for example, a predetermined material such as a transparent acrylic resin. The pipe member 102 is set on the base casing 101. Namely, a lower end portion of the pipe member 102 is set on a top surface of the base casing 101 at a plurality of positions, in this embodiment, four positions by using L-shaped metal angles 107. A size of the pipe member 102 relates to the one having, for example, a length of 1000 mm; a diameter of 100 mm and a thickness of 2 mm.

In both ends of the L-shaped metal angles 107, round holes for a screw, not shown, are bored. An end of the L-shaped angle 107 is screwed to the top surface of the base casing 101 by a screw 109. Each screw hole, not shown, to which a screw thread of the screw 109 is secured is formed in the base casing 101. The end of the L-shaped angle 107 is secured to the top surface of the base casing 101 through a damper member 108 constituted of ring-shaped rubber member.

The other end of the L-shaped angle 107 is secured to a lower end portion of the pipe member 102 by a screw 110 and a nut 111. Each screw hole, not shown, to which a screw thread of the screw 110 is secured is formed in the lower end portion of the pipe member 102. Damper members 112, 113 each constituted of ring-shaped rubber member stand between the other end of the L-shaped angle 107 and an outer surface of the pipe member 102 and between the nut 111 and an inner surface of the pipe member 102, respectively.

The damper members 108, 112, 113 thus intervened prevent any vibration (elastic wave) by the magnetostrictive actuators 103 from propagating to the base casing 101 through the pipe member 102 and the L-shaped angles 107, thereby avoiding localizing any sound image to the base casing 101.

Plural magnetostrictive actuators 103, in this embodiment, four magnetostrictive actuators are set on the base casing 101. These four magnetostrictive actuators 103 are positioned at the same distance under and along a circular lower end surface of the pipe member 102. On the top surface of the base casing 101, hollows 114 each for containing the magnetostrictive actuator 103 are formed. The magnetostrictive actuators 103 are respectively set on the base casing 101 with them being respectively contained in the hollows 114.

Each of the magnetostrictive actuators 103 is set on a bottom of the hollow 114 in the base casing 101 through a damper member 115 constituted of ring-shaped rubber member. The damper member 115 thus intervened prevents any vibration by the magnetostrictive actuator 103 from propagating to the base casing 101, thereby avoiding localizing any sound image to the base casing 101.

When each of the magnetostrictive actuators 103 is set on the base casing 101 with them being contained in the hollows 114 thereof, the driving rod 103a of each of the magnetostrictive actuators 103 is attached to the lower end surface of the pipe member 102. In this moment, a displacement direction of each of the driving rods 103a is oriented to a direction orthogonal to the lower end surface of the pipe member 102, namely, an axis direction of the pipe member 102. This axis direction corresponds to a direction along a plane of the pipe member 102 (a direction parallel to the plane of the pipe member 102). Such a configuration enables the magnetostrictive actuators 103 to vibrate with the lower end surface of the pipe member 102 by their component of the vibration that is orthogonal to the lower end surface of the pipe member 102.

Figure 5:
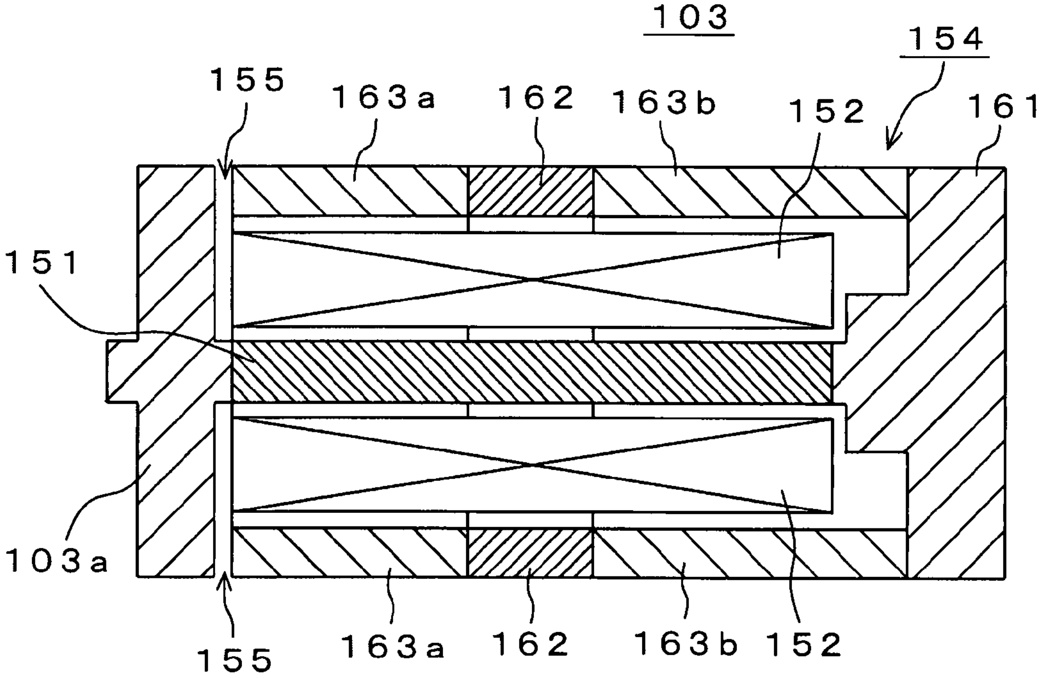
FIG. 5 is a sectional schematic view of a magnetostrictive actuator.

FIG. 5 shows a configuration of any one of the magnetostrictive actuators 103. This magnetostrictive actuator 103 has a rod-like magnetostrictive element 151 that is displaced along its extension direction, a solenoid coil 152 for generating a magnetic field in order to apply a control magnetic field to the magnetostrictive element 151, which is positioned around this magnetostrictive element 151, a driving rod **103*a* as driving member, which is connected to an end of the magnetostrictive element 151 and transmits any displacement output of the magnetostrictive actuator 103, and a container 154 that contains the magnetostrictive element 151 and the solenoid coil 152** therein.

The container 154 is constituted of a fixed disk foot 161, a permanent magnet 162, and tubular cases **163*a*, 163*b*. The other end of the magnetostrictive element 151 is connected to the fixed disk foot 161 so that it can support the magnetostrictive element 151. The permanent magnet 162 that applies a biased static magnetic field to he magnetostrictive element 151 and the tubular cases 163*a*, 163*b* that constitute a magnetic circuit are positioned around the magnetostrictive element 151 that they enclose. The tubular cases 163*a*, 163*b* are installed on both of sides, sides of the driving rod 103*a* and the fixed disk foot 161, of the permanent magnet 162. These tubular cases 163*a*, 163*b* are made of ferromagnetic materials so that the biased static magnetic field can be effectively applied to the magnetostrictive element 151. If the fixed disk foot 161 is also made of ferromagnetic materials, the biased static magnetic field can be more effectively applied to the magnetostrictive element 151**.

There is a gap 155 between the driving rod **103*a* and the container 154. The driving rod 103*a* is made of ferromagnetic materials, so that it can be pulled by the permanent magnet 162 through the gap 155. Such a configuration enables the magnetic force of pull-in to occur between the driving rod 103*a* and the container 154. Thus, the magnetic force of pull-in allows a pre-load to be applied against the magnetostrictive element 151 connected to the driving rod 103*a***.

Figure 6:
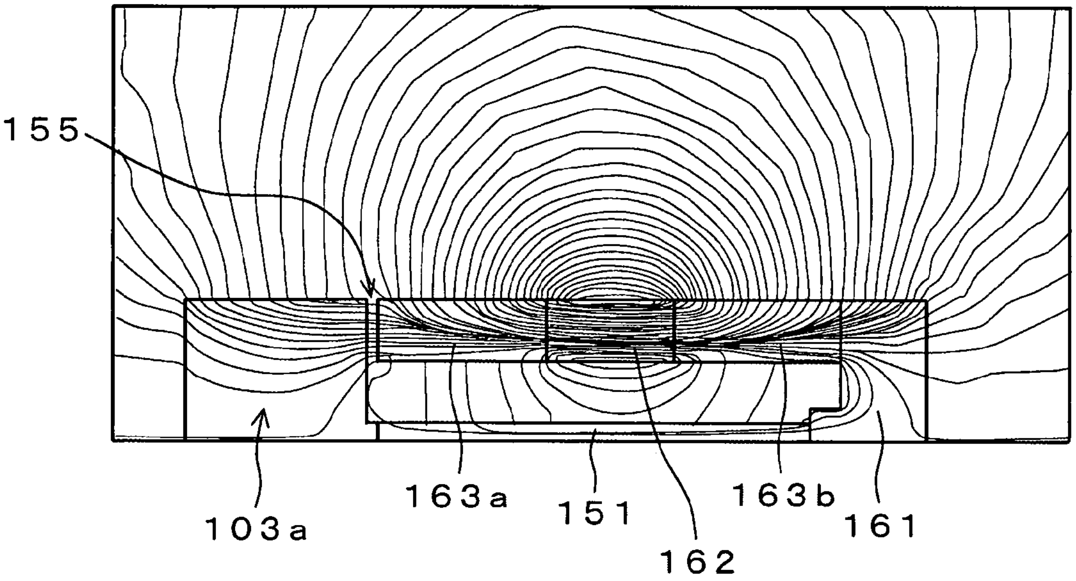
FIG. 6 is a diagram for showing lines of magnetic induction.

FIG. 6 shows lines of magnetic induction in the magnetostrictive actuator 103 shown in FIG. 5. The lines of magnetic induction started from the permanent magnet 162 pass through the tubular case **163*a*, the gap 155, the driving rod 103*a*, and the fixed disk foot 161 and return to the permanent magnet 162 via the tubular case 163*b*. This causes the magnetic force of pull-in to occur between driving rod 103*a* and the container 154 so that the magnetic force of pull-in allows a pre-load to be applied against the magnetostrictive element 151. A part of the lines of magnetic induction started from the permanent magnet 162 passes through the tubular case 163*a*, the gap 155, the driving rod 103*a*, the magnetostrictive element 151, and the fixed disk foot 161 and returns to the permanent magnet 162 via the tubular case 163*b*. This enables a biased static magnetic field to be applied to the magnetostrictive element 151**.

In the magnetostrictive actuator 103, the driving rod **103*a* is not supported by a bearing. This enables no problem about a friction of the driving rod 103*a*** with the bearing to arise, thereby reducing loss of the displacement output substantially.

In the magnetostrictive actuator 103, the magnetic force of pull-in allows a pre-load to be applied against the magnetostrictive element 151. This allows the pre-load to keep being stably applied thereto even if a period of the displacement by the magnetostrictive element 151 is short, thereby obtaining a proper displacement output based on the control current supplied to the solenoid coil 152.

Thus, in the magnetostrictive actuator 103, a relationship between the control current flown through the solenoid coil 152 and the displacement of the driving rod 103*a* comes closer to a linear one. This enables any distortion generated based on a characteristic of the magnetostrictive actuator 103 to be decreased, thereby reducing a burden of feedback adjustment.

In the magnetostrictive actuator 103, the permanent magnet 162 stands between two tubular cases 163*a*, 163*b* so that the biased static magnetic field can be more uniformly applied to the magnetostrictive element 151 as compared with a case where the permanent magnet is installed on a position of the fixed disk foot 161. In this embodiment, it may be not necessary to provide the magnetostrictive actuator 103 with any bearing for supporting the driving rod 103*a*, any coupling member for coupling the driving rod 103*a* to the container 154, any spring for applying a pre-load to the magnetostrictive element 151, and the like, thereby allowing the magnetostrictive actuator 103 to be easily downsized and manufactured at a low price.

The pipe member 102 and each of the magnetostrictive actuators 103 constitute a speaker component for high frequency range in an audio frequency band to act as a tweeter. The speaker unit 104 constitutes a speaker component for low frequency range in the audio frequency band to act as a woofer.

The speaker unit 104 is installed on the base casing 101 by using screws, not shown, with its front side being put upside down and its main body being received in the opening 105 at a lower end of the base casing 101.

In this embodiment, the speaker unit 104 is arranged so that it can be put on the same axis as that of the pipe member 102. Sound wave of positive phase radiated from the front side of the speaker unit 104 radiates to outside by passing through the bottom of the base casing 101. Sound wave of negative phase radiated from the back side of the speaker unit 104 radiates from an upper end of the pipe member 102 to outside by passing through the opening 105 and the pipe member 102. In this embodiment, the pipe member 102 acts as a resonator.

A damper member 116 made of, for example, rubber material is arranged between the lower end surface of the pipe member 102 and the top surface of the base casing 101. This prevents any vibration by the magnetostrictive actuators 103 from propagating to the base casing 101 through the pipe member 102 and enhances sealing by the pipe member 102 so that the pipe member 102 can act as the resonator excellently.

Figure 7:
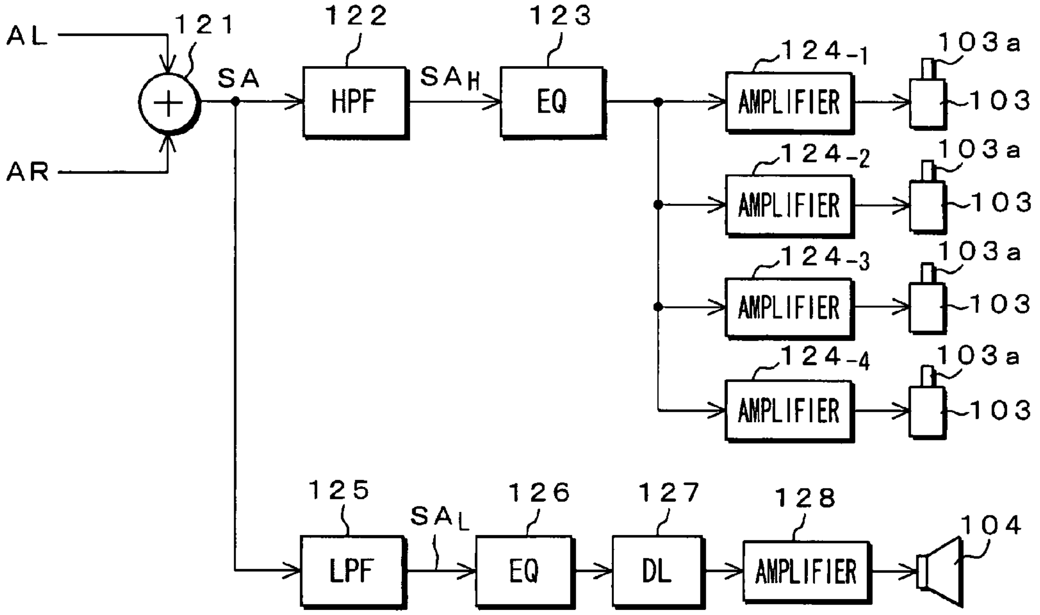
FIG. 7 is a block diagram for showing a configuration of a driving system for the magnetostrictive actuators and a speaker unit.

FIG. 7 shows a configuration of a driving system for the four magnetostrictive actuators 103 and the speaker unit 104.

Left component AL and right component AR of the acoustic signal, which constitute a stereo acoustic signal, are supplied to an adder 121. The adder adds these components AL, AR of the acoustic signal to each other to produce a monaural acoustic signal SA. A high-pass filter 122 receives the monaural acoustic signal SA and extracts its high frequency range component SAH therefrom. An equalizer 123 receives this high frequency range component SAH and adjusts its frequency characteristic so that it can correspond to the magnetostrictive actuators 103. Amplifiers 124-1 through 124-4 respectively receive and amplify the adjusted high frequency range component SAH to supply it to the four magnetostrictive actuators 103 as the control signal therefor. This enables the four magnetostrictive actuators 103 to be driven by the same high frequency range component SAH, so that their driving rods 103*a* can displace corresponding to the high frequency range component SAH.

A low-pass filter 125 receives the monaural acoustic signal SA and extracts its low frequency range component SAL therefrom. An equalizer 126 receives this low frequency range component SAL and adjusts its frequency characteristic so that it can correspond to the resonator constituted of the pipe member 102. A delay circuit 127 receives and delays the adjusted low frequency range component SAL by some milliseconds. An amplifier 128 receives and amplifies the delayed low frequency range component SAL to supply it to the speaker unit 104 as the control signal therefor. This enables the speaker unit 104 to be driven by the low frequency range component SAL.

Inserting the delay circuit 127 into a supply path of the low frequency range component SAL to the speaker unit 104 enables to be delayed a point of time when sound wave of low frequency range radiates from the speaker unit 104 as compared with a point of time when sound wave of high frequency range radiates from the pipe member 102. This causes a listener to be liable to feel a sound image on the pipe member 102 that radiates the sound wave of high frequency range based on listening characteristic of human being such that a sound image is depended on a high frequency range of the listened sound.

The following will describe operations of the speaker 100A shown in FIGS. 1 through 4.

The four magnetostrictive actuators 103 contained and set in the base casing 101 are driven by the high frequency range component SAH of the monaural acoustic signal SA. Their driving rods 103*a* displace corresponding to the high frequency range component SAH. Based on the displacement of each of the driving rods 103*a*, the pipe member 102 vibrates by a component of the vibration by the driving rods 103*a* orthogonal to the lower end surface of the pipe member 102 (along a plane of the pipe member 102).

The lower end surface of the pipe member 102 is excited by a longitudinal wave and an elastic wave (vibration) propagates to the pipe member 102 along the plane direction thereof. When this elastic wave propagates to the pipe member 102, the elastic wave repeats mode exchanges of a longitudinal wave to a transverse wave and vice versa, so that the longitudinal wave and the transverse wave can be mingled therein. The transverse wave excites vibration in a horizontal direction of the pipe member 102 (i.e., a direction orthogonal to the plane of the pipe member 102). This enables sound wave to radiate from the pipe member 102 to outside. In other words, an outer surface of the pipe member 102 can emit an acoustic output of high frequency range that corresponds to the high frequency range component SAH.

It is to be noted that, in this embodiment, the four magnetostrictive actuators 103 that are arranged in the base casing 101 at the same distance under and along a circular lower end surface of the pipe member 102 are driven on the basis of the same high frequency range component SAH of the monaural acoustic signal SA, so that a circumference of the pipe member 102 can emit an acoustic output of high frequency range with omni-directionality.

Further, the speaker unit 104 installed on the bottom surface of the base casing 101 is driven on the basis of the low frequency range component SAL of the monaural acoustic signal SA. The front surface of the speaker unit 104 emits an acoustic output of low frequency range (positive phase), so that this acoustic output can be emitted through the bottom surface of the base casing 101 to outside. The back surface of the speaker unit 104 emits an acoustic output of low frequency range (negative phase), so that this acoustic output can be emitted from the top of the pipe member 102 to outside through the opening 105 and the pipe member 102.

According to the speaker 100A shown in FIGS. 1 through 4, the magnetostrictive actuators 103 driven on the basis of the high frequency range component SAH of the monaural acoustic signal SA vibrate with the lower end surface of the pipe member 102 by their component of vibration orthogonal to the lower end surface of the pipe member 102. This prevents large transverse wave from occurring at a vibration point. Therefore, a listener does not listen to sound wave from the vibration point being sounded very loud, as compared by that from another position, so that an acoustic image can be created over a whole of the pipe member 102 in its longitudinal direction. This causes a global acoustic image to be obtained.

The following will describe simulations wherein a constant acceleration is input and an output is shown as the acceleration if the pipe member 102 vibrates at the lower end surface thereof in an axis direction thereof (case 1) and if the pipe member 102 vibrates at the lower end surface thereof in a radial direction thereof (case 2). In these simulations, it is supposed that the pipe member 102, made of acrylic resin, having a length of 1000 mm, a diameter of 100 mm, and a thickness of 2 mm is used.

Figure 8:
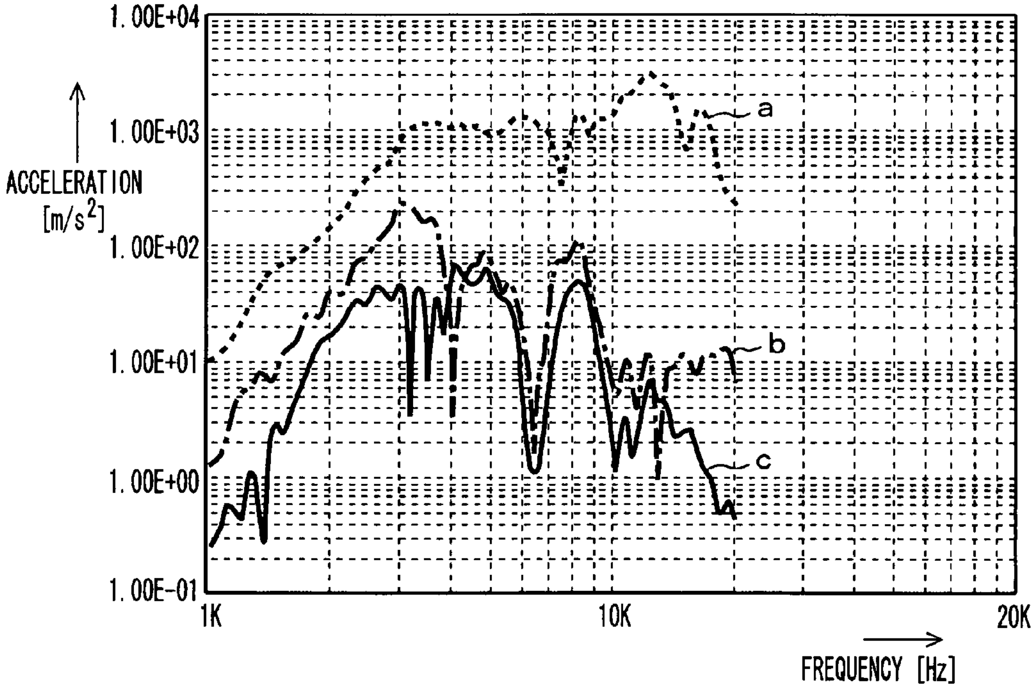
FIG. 8 is a graph for showing a result of a simulation of frequency response at each of the bottom position, the center position, and the top position of a pipe member when the pipe member vibrates in its radial direction.
Figure 9:
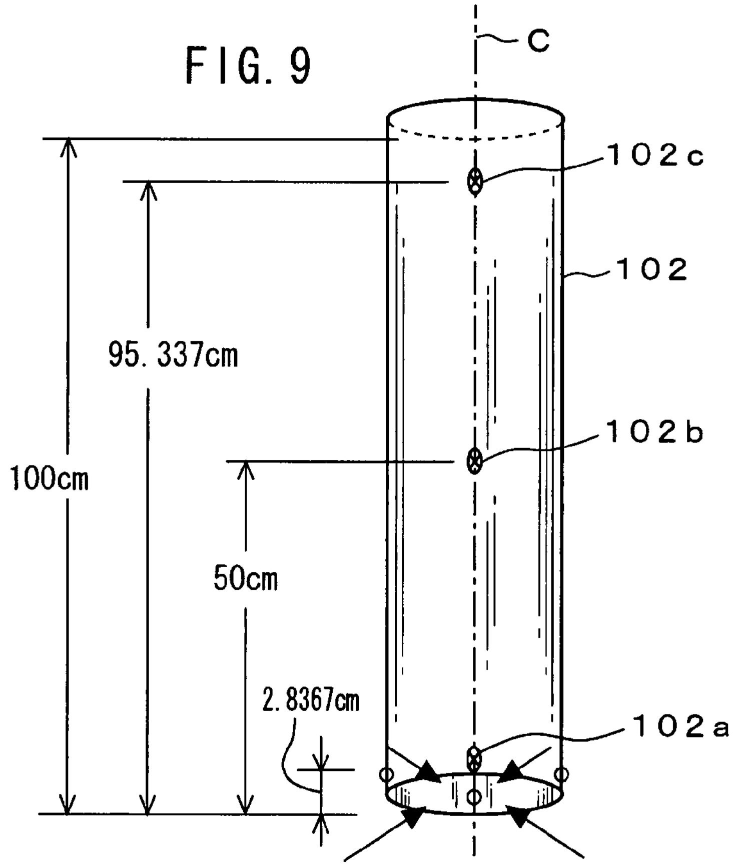
FIG. 9 is a diagram for illustrating a vibration direction when the pipe member vibrates in its radial direction.

FIG. 8 shows a result of the simulation when the pipe member 102 vibrates in its radial direction, as indicated by arrows of FIG. 9. A curve "a" indicates a frequency response at a bottom position 102*a* of the pipe member 102 that is positioned on a center axis C away from the lower end surface of the pipe member 102 by 2.8367 cm; a curve "b" indicates a frequency response at a center position 102*b* of the pipe member 102 that is positioned on the center axis C away from the lower end surface of the pipe member 102 by 50 cm; and a curve "c" indicates a frequency response at a top position 102*c* of the pipe member 102 that is positioned on the center axis C away from the lower end surface of the pipe member 102 by 95. 337 cm.

If the pipe member 102 vibrates in its radial direction, a large transverse wave occurs at a vibration point. Therefore, a listener can listen to sound wave from the vibration point being sounded very loud, as compared by that from another position, so that a difference between the accelerations (sound pressures) at the positions can be made relatively large, as shown in FIG. 8. This causes the listener to feel any uneven sound pressures at the positions of the pipe member 102 in its longitudinal direction. This prevents a global acoustic image from being obtained.

Figure 10:
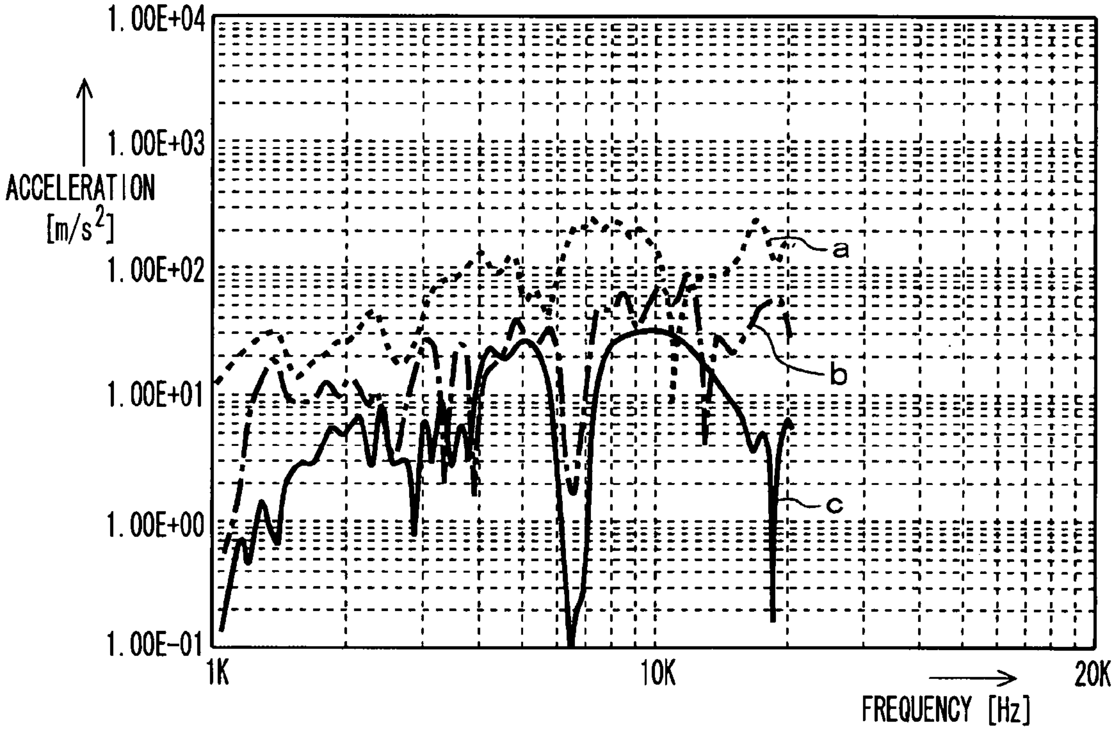
FIG. 10 is a graph for showing a result of a simulation of frequency response at each of the bottom position, the center position, and the top position of a pipe member when the pipe member vibrates in its axis direction.
Figure 11:
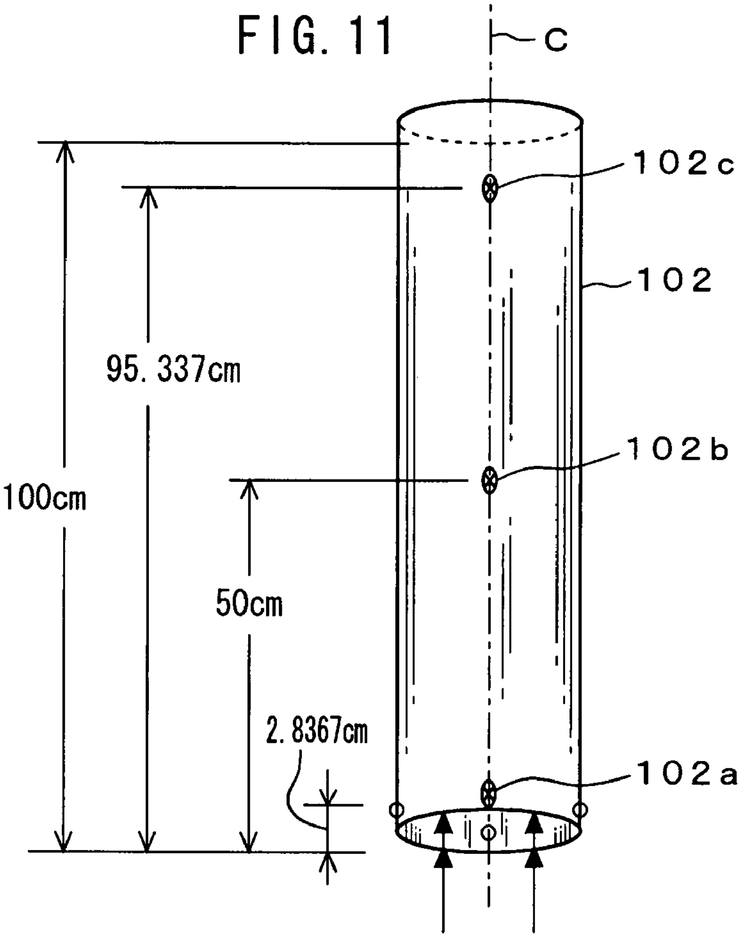
FIG. 11 is a diagram for illustrating a vibration direction when the pipe member vibrates in its axis direction.

FIG. 10 shows a result of the simulation when the pipe member 102 vibrates in its axis direction, as indicated by arrows of FIG. 11. A curve "a" indicates a frequency response at a bottom position 102*a* of the pipe member 102 that is positioned on a center axis C away from the lower end surface of the pipe member 102 by 2.8367 cm; a curve "b" indicates a frequency response at a center position 102*b* of the pipe member 102 that is positioned on the center axis C away from the lower end surface of the pipe member 102 by 50 cm; and a curve "c" indicates a frequency response at a top position 102*c* of the pipe member 102 that is positioned on the center axis C away from the lower end surface of the pipe member 102 by 95. 337 cm.

If the pipe member 102 vibrates in its axis direction (a direction orthogonal to the lower end surface of the pipe member 102), no large transverse wave occurs at a vibration point. Therefore, a listener does not listen to sound wave from the vibration point being sounded very loud, as compared by that from another position, so that a difference between the accelerations (sound pressures) at the positions can be made relatively small, as shown in FIG. 10. This causes the listener to feel any even sound pressures at the positions of the pipe member 102 in its longitudinal direction. This allows a global acoustic image to be obtained.

According to the speaker 100A shown in FIGS. 1 through 4, the magnetostrictive actuators 103 vibrate with the lower end surface of the pipe member 102, so that sound wave can radiate from the positions of the pipe member 102 in its longitudinal direction. This enables the acoustic output of high frequency range corresponding to the high frequency range component SAH of the monaural acoustic signal SA to be emitted from an outer surface of the pipe member 102. Therefore, in this speaker 100A, any driving device such as the magnetostrictive actuator is not present at a position of the pipe member 102 wherein sound image is created, so that if the pipe member 102 is made of complete transparent material, no driving device is seen. Thus, it is possible to display any visual information relative to, for example, the emitted sound on the pipe member 102 without being interrupted with the driving device.

According to the speaker 100A shown in FIGS. 1 through 4, an acoustic output of low frequency range (positive phase) radiated from the front surface of the speaker unit 104 installed on the bottom of the base casing 101 can be emitted through the bottom surface of the base casing 101 to outside and the acoustic output of low frequency range (negative phase) emitted from the back surface of the speaker unit 104 can be emitted from the top of the pipe member 102 to outside through the opening 105 and the pipe member 102. This enables the listener to feel any even sound pressures relative to the acoustic output of low frequency range at the positions of the pipe member 102 in its longitudinal direction, thereby creating the sound image over a whole of the pipe member 102 in its longitudinal direction, to obtain a global acoustic image.

Sound pressure levels (SPL) at a top position M1 and a bottom position M2, which are respectively away from each of the upper portion and the lower portion of the pipe member 102 by one meter, in the following measurements (1) and (2) were measured using microphones: The measurement (1) relates to a case where sound wave SW radiates from only the top of the pipe member 102 and the measurement (2) relates to a case where sound waves SW, SW radiate from both of the top and the bottom of the pipe member 102.

Figure 12:
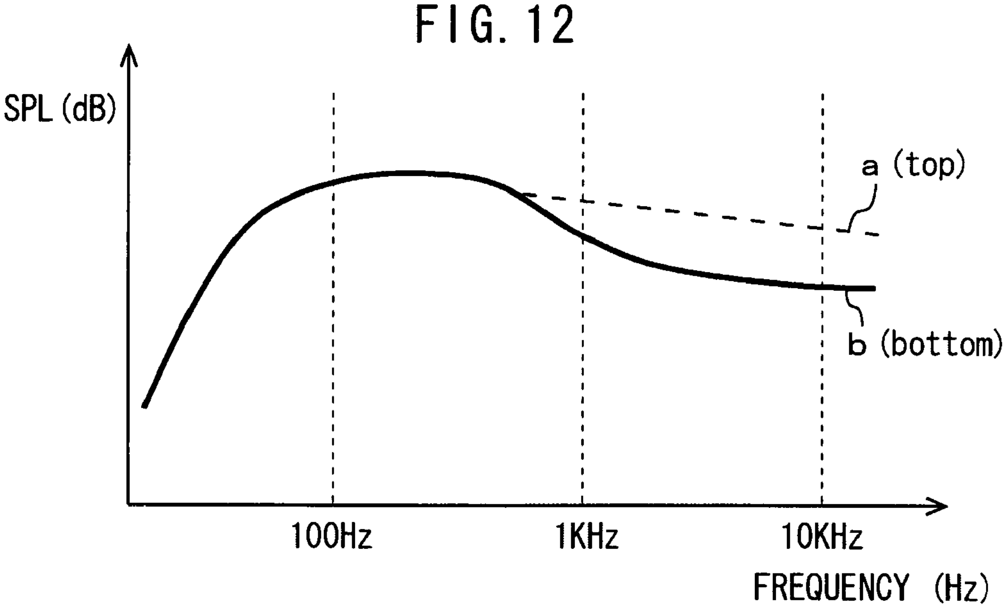
FIG. 12 is a graph for showing a result of a sound pressure level (SPL) measurement at each of the top and bottom positions of the pipe member when sound wave radiates from only the top of the pipe member.
Figure 13:
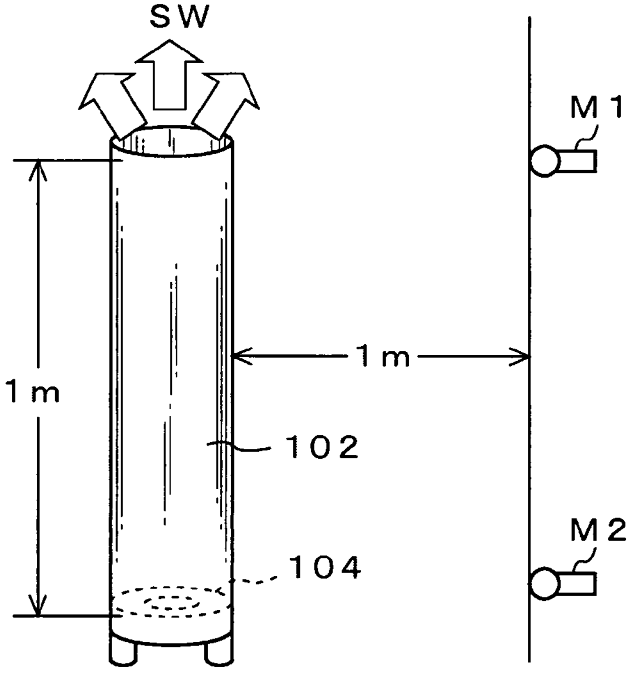
FIG. 13 is a diagram for illustrating a radiation direction of the sound wave and positions to be measured when sound wave radiates from only the top of the pipe member.

FIG. 12 shows a result of the measurement (1) when the sound wave SW radiates from only the top of the pipe member 102, as indicated by arrows of FIG. 13. A curve "a" indicates SPL at the top position M1 and a curve "b" indicates SPL at the bottom position M2. As shown in FIG. 12, when the sound wave SW radiates from only the top of the a pipe member 102, SPL at the bottom position M2 is lower than that at the top position M1. This prevents the listener from feeling any even sound pressures relative to the acoustic output of low frequency range over a whole of the pipe member 102 in its longitudinal direction.

Figure 14:
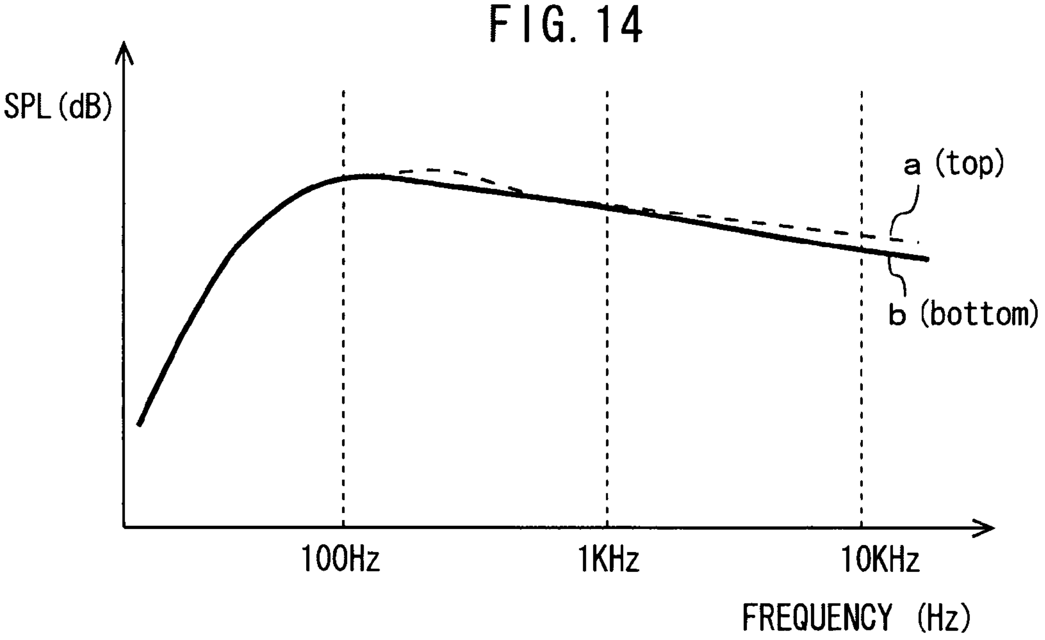
FIG. 14 is a graph for showing a result of the SPL measurement at each of the top and bottom positions of a pipe member when sound wave radiates from both of the top and the bottom of the pipe member.
Figure 15:
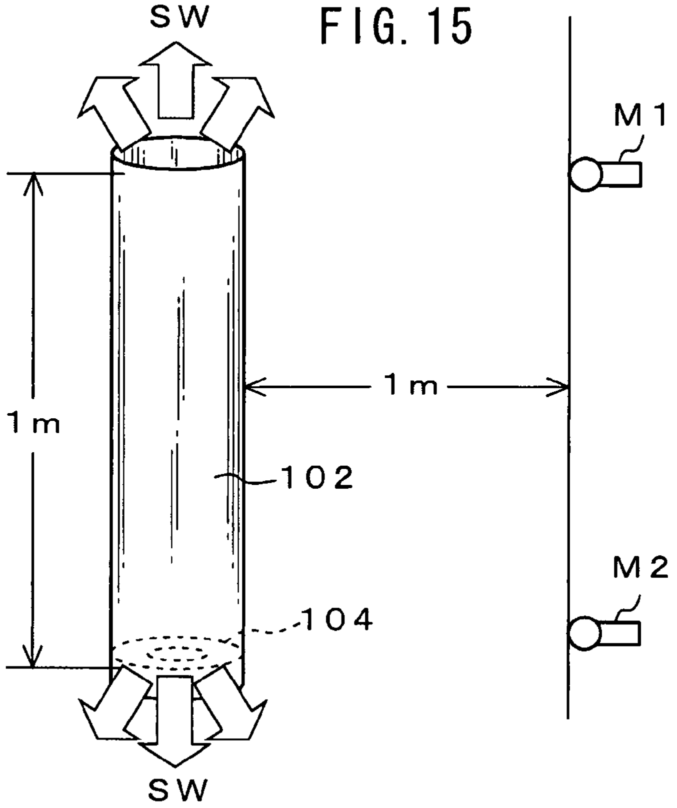
FIG. 15 is a diagram for illustrating a radiation direction of the sound wave and positions to be measured when sound wave radiates from both of the top and the bottom of the pipe member.

FIG. 14 shows a result of the measurement (2) when the sound waves SW, SW radiate from both of the top and the bottom of the pipe member 102, as indicated by arrows of FIG. 15. A curve "a" indicates SPL at the top position M1 and a curve "b" indicates SPL at the bottom position M2. As shown in FIG. 14, when the sound waves SW, SW radiates from both of the top and the bottom of the pipe member 102, SPL at the bottom position M2 is almost equal to that at the top position M1. This allows the listener to feel any even sound pressures relative to the acoustic output of low frequency range over a whole of the pipe member 102 in its longitudinal direction.

The driving system for the magnetostrictive actuators 103 and the speaker unit 104 has been described so that its configuration can be become that shown in FIG. 7 and the four magnetostrictive actuators 103 can be driven by the same high frequency range component SAH of the monaural acoustic signal SA. According to an embodiment, however, these four magnetostrictive actuators 103 can be driven by any separate high frequency range components SAH.

Figure 16:
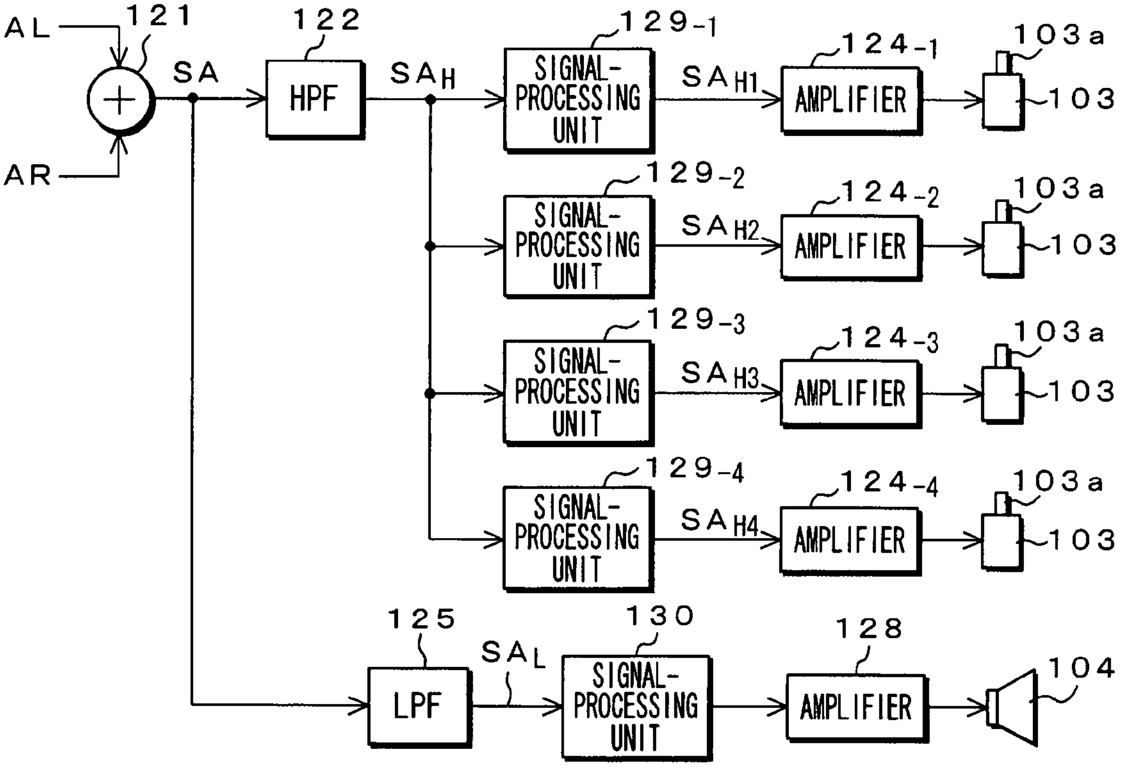
FIG. 16 is a block diagram for showing another configuration of a driving system for magnetostrictive actuators and a speaker unit.

FIG. 16 shows another configuration of the driving system for the four magnetostrictive actuators 103 and the speaker unit 104. In FIG. 16, like reference numbers refer to like elements of FIG. 7, a detailed explanation of which will be omitted.

The high frequency range component SAH of the monaural acoustic signal SA extracted by a high pass filter (HPF) 122 is supplied to four signal-processing units 129-1 through 129-4. These four signal-processing units 129-1 through 129-4 respectively adjust the high frequency range component SAH, separately, on its level, delay time, frequency characteristic and the like (i.e., perform any sound field control processing) and perform any signal compensation processing relative to output characteristics of the magnetostrictive actuator 103. Amplifiers 124-1 through 124-4 respectively receive the high frequency range components SAH1 through SAH4 from the four signal-processing units 129-1 through 129-4 and amplify them. Four magnetostrictive actuators 103 then receive the amplified high frequency range components SAH1 through SAH4, respectively, as the driving signals therefor. Thus, these four magnetostrictive actuators 103 are respectively driven on the basis of the separate high frequency range components SAH1 through SAH4, thereby enabling the driving rods 103*a* of these magnetostrictive actuators 103 to be separately displaced on the basis of the high frequency range components SAH1 through SAH4.

The low frequency range component SAL of the monaural acoustic signal SA extracted by a low pass filter (LPF) 125 is supplied to a signal-processing unit 130. The signal-processing unit 130 adjusts the low frequency range component SAL on its level, delay time, frequency characteristic and the like (i.e., performs any sound field control processing) and perform any signal compensation processing relative to resonance characteristics. An amplifier 128 receives the low frequency range component SAL from the signal-processing unit 130 and amplifies it. Speaker unit 104 then receives the amplified low frequency range component SAL as the driving signal therefor. Thus, the speaker unit 104 is driven on the basis of the low frequency range component SAL.

According to the configuration of the driving system shown in FIG. 16, these four magnetostrictive actuators 103 are respectively driven on the basis of the high frequency range components SAH1 through SAH4, which are separately obtained by processing in the signal-processing units 129-1 through 129-4, so that it is possible to enhance a global acoustic image.

It is to be noted that although, in the configuration of the driving system shown in FIG. 16, the high frequency range components SAH1 through SAH4 for driving the four magnetostrictive actuators 103 have been extracted from the monaural acoustic signal SA, in an embodiment of the invention, they can be extracted from the left acoustic signal AL and the right acoustic signal AR, which constitute a stereo acoustic signal, or from multi-channel acoustic signal.

Figure 17:
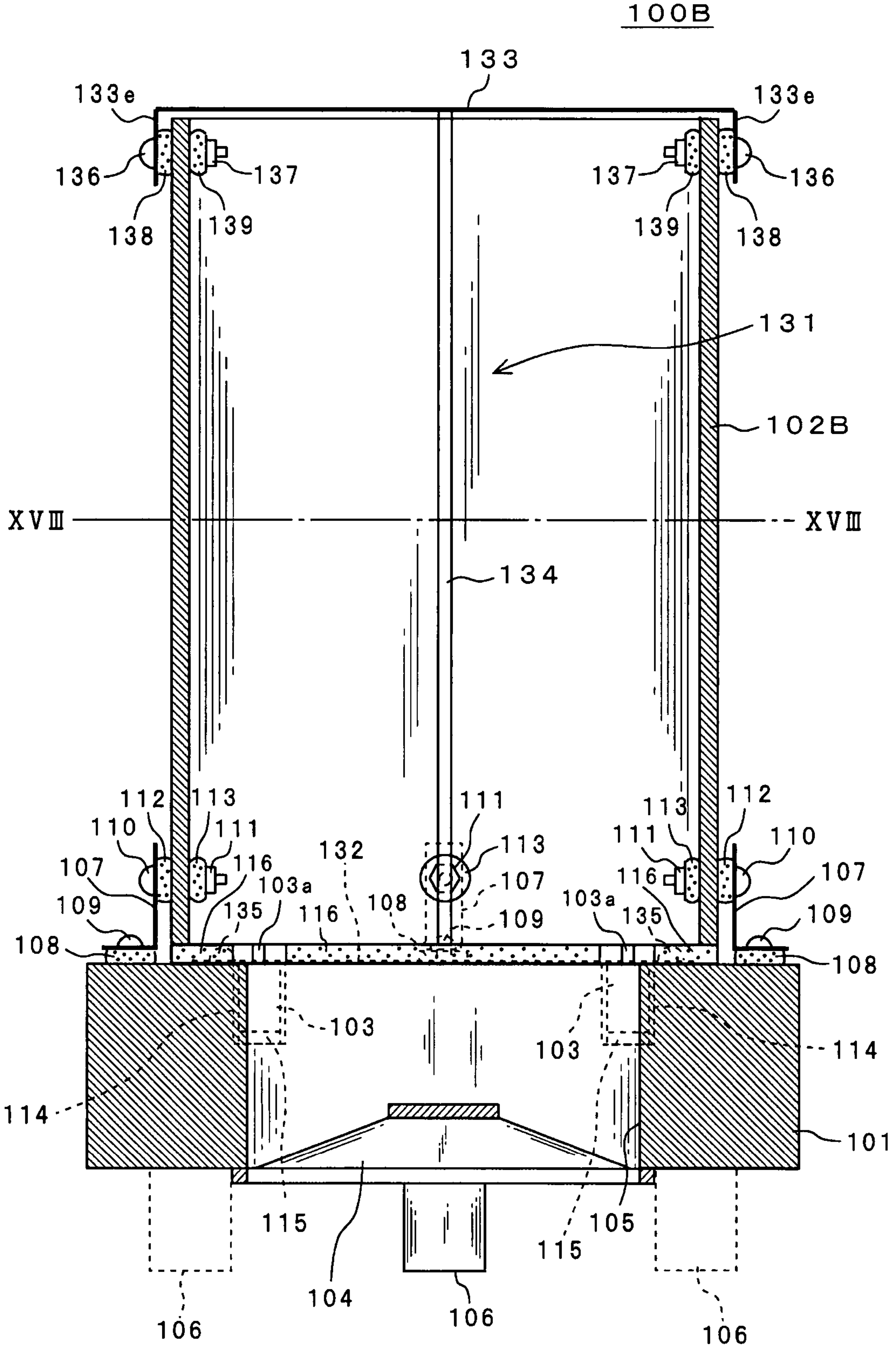
FIG. 17 is a vertical sectional view of a speaker 100B according to another embodiment of the invention.
Figure 18:
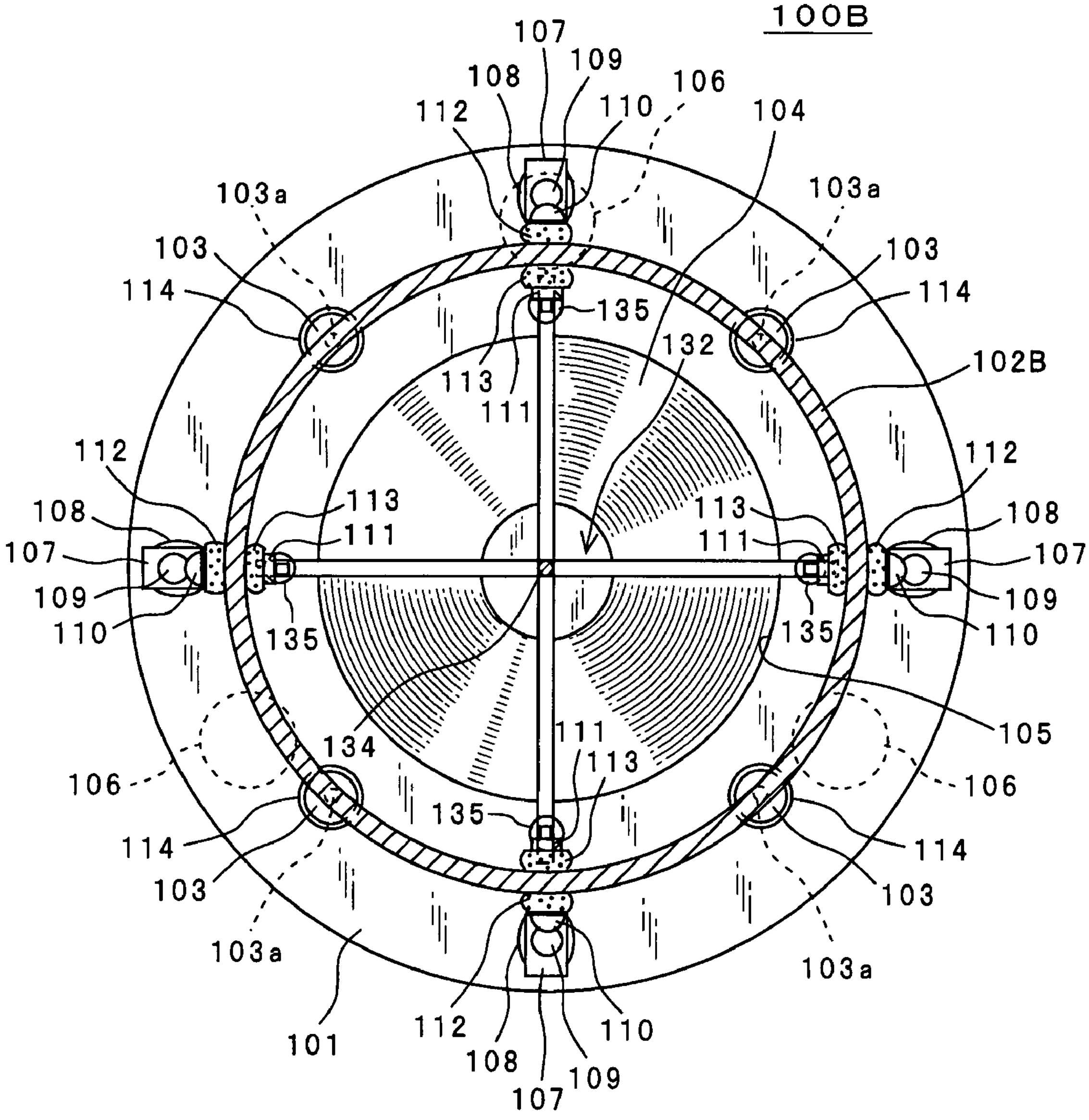
FIG. 18 is a traverse sectional view of the speaker 100B according to the above another embodiment of the invention, taken along the lines XVIII-XVIII shown in FIG. 17.
Figure 19:
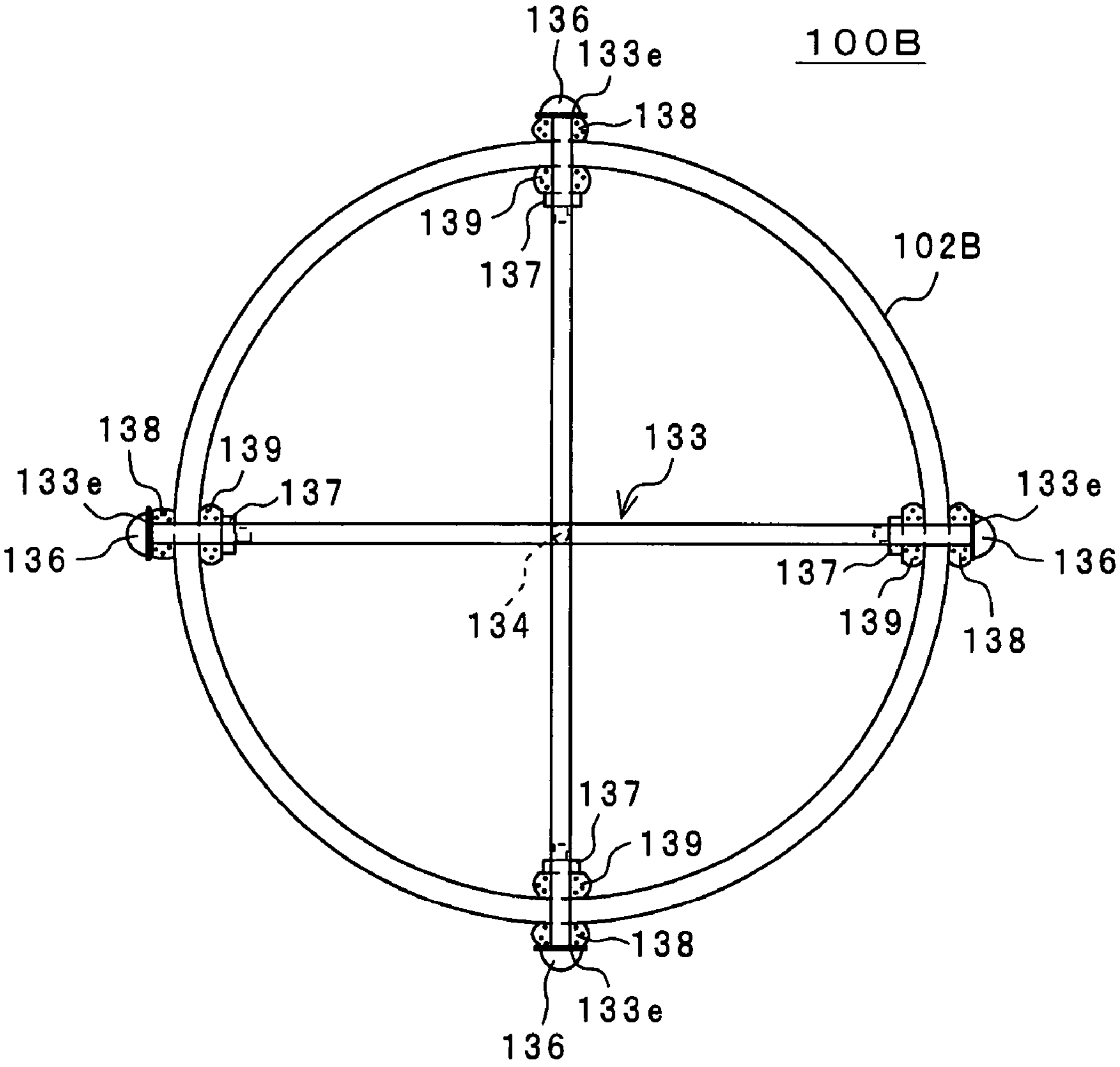
FIG. 19 is a partially omitted top plan view of the speaker 100B according to the above another embodiment of the invention.

The following will describe a speaker 100B according to another embodiment of the invention. FIGS. 17 through 19 show a configuration of the speaker 100B according to this another embodiment of the invention. FIG. 17 shows a vertical sectional view of the speaker 100B; FIG. 18 is a traverse sectional view of the speaker 100B, a lower portion of which is clearly shown taken along the lines XVIII-XVIII shown in FIG. 17; and FIG. 19 is a top plan view of the speaker 100B (a lower portion of which is shown taken along the lines XVIII-XVIII shown in FIG. 17 will be omitted). In FIGS. 17 through 19, like reference numbers refer to like elements of FIGS. 1 through 4, a detailed explanation of which will be omitted.

The speaker 100B has a supporting member 131 that supports the pipe member 102B, in addition to the configuration of the speaker 100A shown in FIGS. 1 through 4. The supporting member 131 has lower crossed bars 132 to be set on the top surface of the base casing 101, upper crossed bars 133 to be set on the top of the pipe member 102B, and a rod 134. An end of the rod 134 is connected to a center of the lower crossed bars 132 and the other end thereof is connected to a center of the upper crossed bars 133.

Four ends of the lower crossed bars 132 respectively have round holes for screws, not shown. The four ends thereof are respectively secured to the top surface of the base casing 101 by screws 135. Each screw hole, not shown, to which a screw thread of each of the screws 135 is secured is formed in the base casing 101.

Four ends 133*e* of the upper crossed bars 133 respectively are made wide and fold down at right angles. These four ends 133*e* respectively have round holes for screws, not shown. The four ends 133*e* of the upper crossed bars 133 are respectively secured to the top portion of the pipe member 102B by screws 136 and nuts 137. Each screw hole, not shown, to which a screw thread of the screw 136 is secured is formed in the top portion of the pipe member 102B.

Damper members 138, 139 each constituted of ring-shaped rubber member stand between each of the four ends 133*e* of the upper crossed bars 133 and the outer surface of the pipe member 102B and between each of the nuts 137 and the inner surface of the pipe member 102B. This prevents the vibration (elastic wave) by the magnetostrictive actuators 103 from propagating to the base casing 101 through the pipe member 102B and the supporting member 131.

Remaining parts of the speaker 100B shown in FIGS. 17 through 19 are similar to those of the speaker 100A shown in FIGS. 1 through 4. The speaker 100B shown in FIGS. 17 through 19 operates similar to the operations of the speaker 100A shown in FIGS. 1 through 4.

According to the speaker 100B, it can attain the excellent effects similar to those of the speaker 100A as well as since the supporting member 131 supports the pipe member 102B, it can secure its equilibrium if the pipe member 102B is elongated. The supporting member 131 includes the rod 134 and the like as described above so that their occupied capacity in the pipe member is made small, which has little influence on any function of the pipe member 102B as a resonator.

Figure 20:
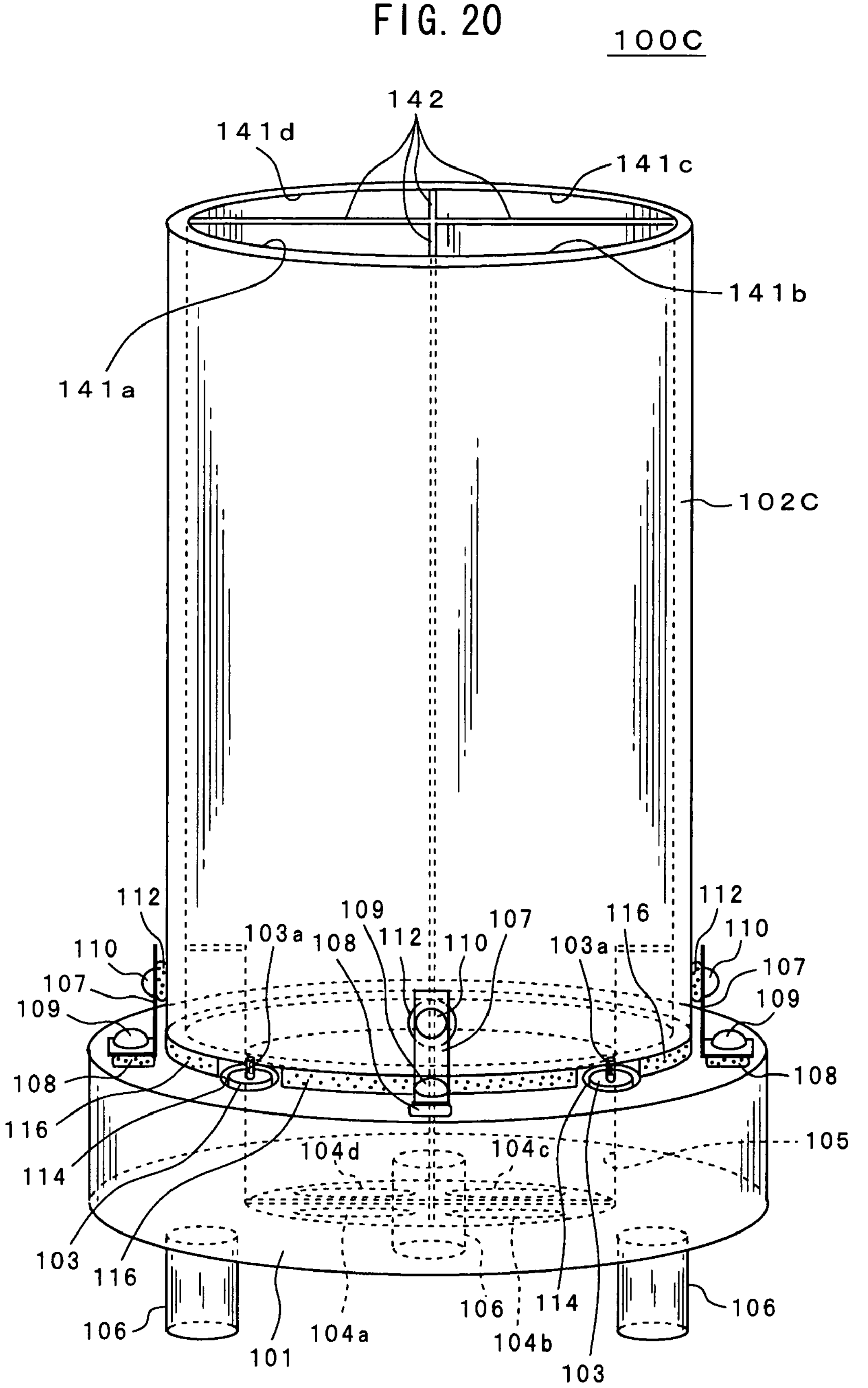
FIG. 20 is a perspective view of a speaker 100C according to further embodiment of the invention.
Figure 21:
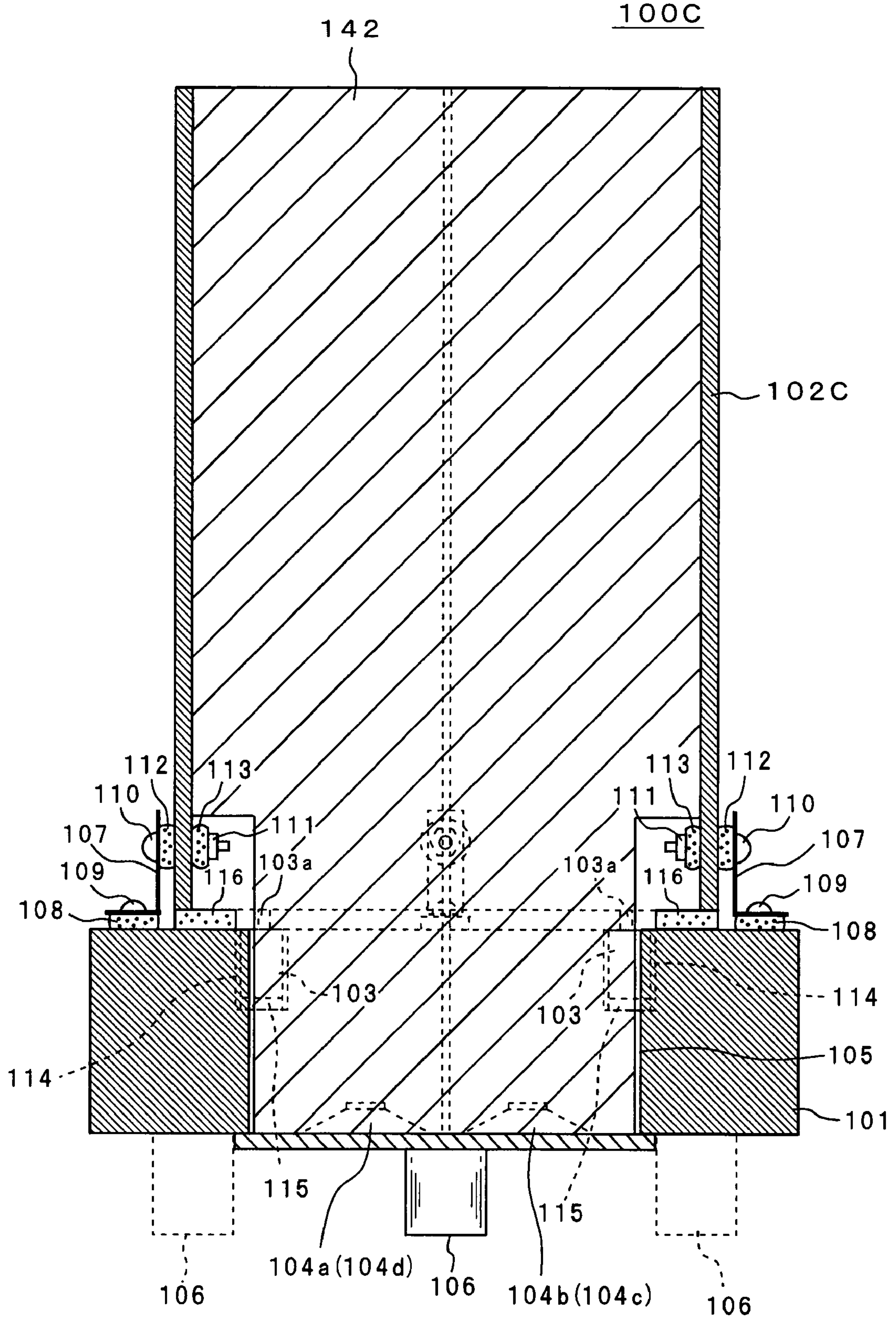
FIG. 21 is a vertical sectional view of the speaker 100C according to the above further embodiment of the invention.
Figure 22:
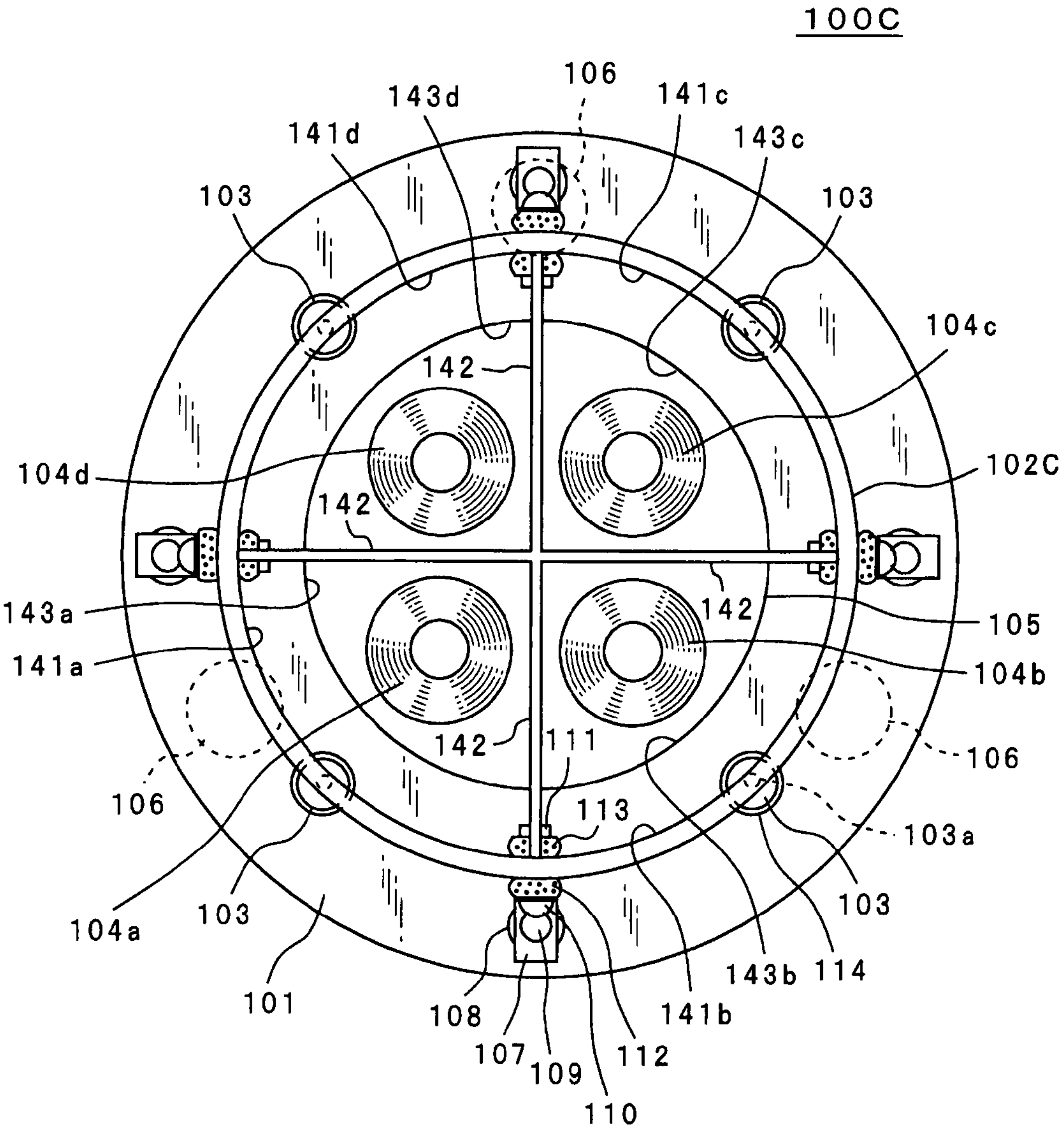
FIG. 22 is a top plan view of the speaker 100C according to the above further embodiment of the invention.
Figure 23:
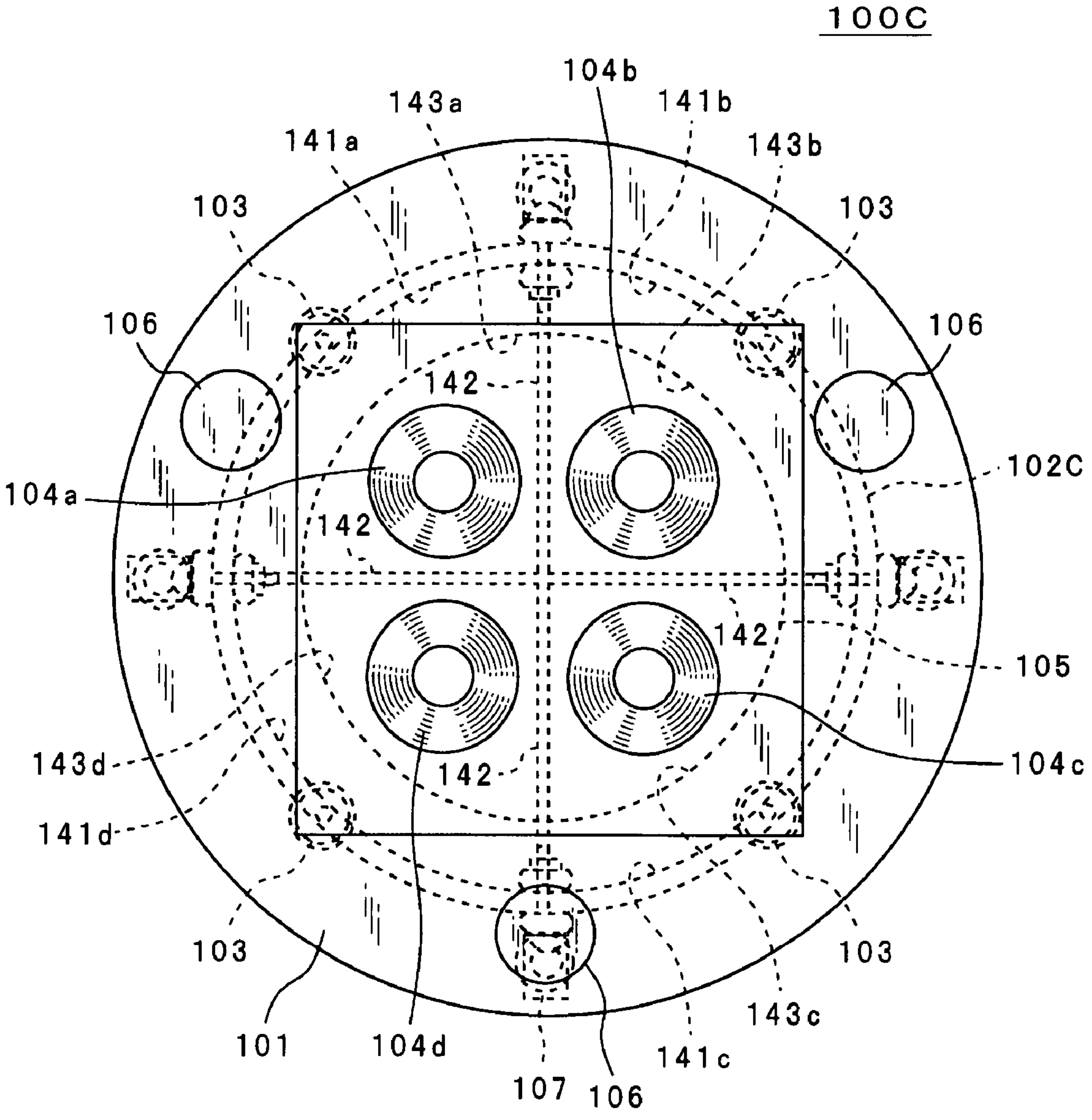
FIG. 23 is a bottom plan view of the speaker 100C according to the above further embodiment of the invention.

The following will describe a speaker 100C according to further embodiment of the invention. FIGS. 20 through 23 show a configuration of the speaker 100C according to the further embodiment of the invention. FIG. 20 shows a perspective view of the speaker 100C; FIG. 21 shows a vertical sectional view thereof; FIG. 22 shows a top plan view thereof; and FIG. 23 shows a bottom plan view thereof. In FIGS. 20 through 23, like reference numbers refer to like elements of FIGS. 1 through 4, a detailed explanation of which will be omitted.

In this speaker 100C, an interior of the pipe member 102 is partitioned by a partition member, for example, a partition wall 142 made of acrylic resin, into plural parts to form plural passages, four passages 141*a* through 141*d* in this embodiment, each extending along an axis direction of the pipe member 102. The partition wall 142 has a transversal section of cross as shown in FIGS. 22 and 23. The partition wall 142 extends, as shown in FIG. 21, from the interior of the pipe member 102 up to the opening 105 of the base casing 101 so that an interior of the base casing 101 can be partitioned thereby into parts to form four separated passages 143*a* through 143*d* corresponding to the passages 141*a* through 141*d*, respectively, as shown in FIGS. 22 and 23. It is to be noted that since the pipe member 102 and the opening 105 of the base casing 101 have different diameters, the partition wall 142 has widths corresponding to the respective diameters thereof to form a stepwise shape in its low position, as shown in FIG. 21.

The speaker 100C has four speaker units 104*a* through 104*d* that are respectively arranged on the same axis as that of the pipe member 102C in each of the four passages 143*a* through 143*d*. These speaker units 104*a* through 104*d* are respectively installed on the bottom of the base casing 101 by using screws, not shown, with their front side being put upside down and their main bodies being respectively received in the separated passages 143*a* through 143*d* at a lower end of the base casing 101.

In this embodiment, the speaker units 104*a* through 104*d* are arranged so that they can be put on the same axis as that of the pipe member 102C in each of the respective passages 143*a* through 143*d*. Sound wave of positive phase radiated from the front side of each of the speaker units 104*a* through 104*d* radiates to outside by passing through the bottom of the base casing 101. Sound wave of negative phase radiated from the back side of each of the speaker units 104a through 104*d* radiates from an upper end of the pipe member 102C to outside by passing through the passages 143*a* through 143*d* and the passages 141*a* through 141*d*. In this embodiment, the pipe member 102 also acts as a resonator.

Figure 24:
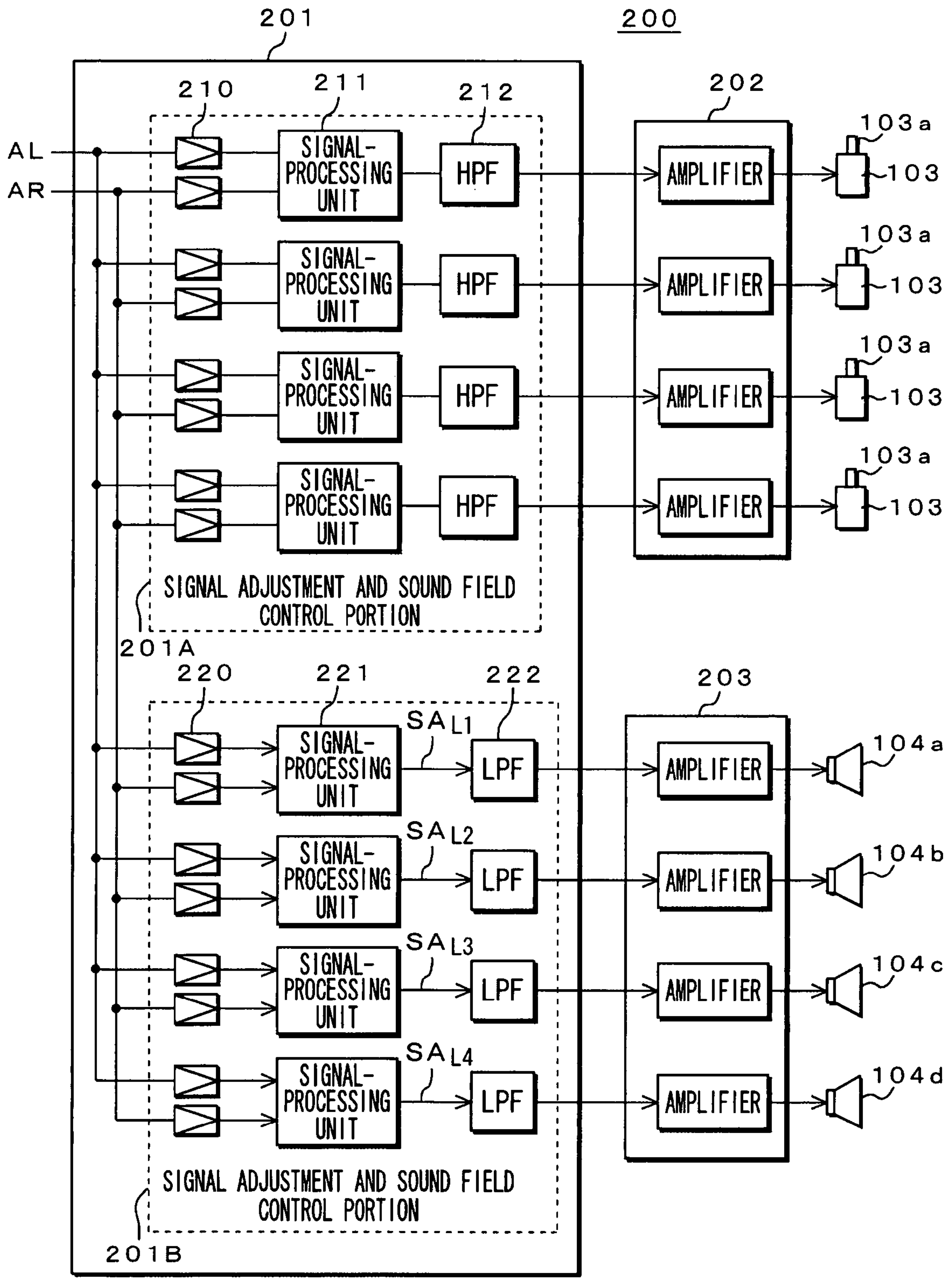
FIG. 24 is a block diagram for showing a configuration of a driving system for magnetostrictive actuators and speaker units.

FIG. 24 shows a configuration of a driving system 200 for the four magnetostrictive actuators 103 and the four speaker units 104*a* through 104*d*.

This driving system 200 has a digital signal processor (DSP) block 201, and amplification blocks 202 and 203. The DSP block 201 has a signal adjustment and sound field control sub-block 201A for the magnetostrictive actuators and a signal adjustment and sound field control sub-block 201B for the speaker units.

The signal adjustment and sound field control sub-block 201A for the magnetostrictive actuators includes four signal-processing units 211 and four high pass filters (HPF) 212 which are respectively corresponded to the four magnetostrictive actuators 103. The signal adjustment and sound field compensation sub-block 201A also includes four pairs of (eight) attenuators 210 each pair for receiving and attenuating a left acoustic signal AL and a right acoustic signal AR that constitute a stereo acoustic signal for each of the four signal-processing units 211.

Each of the signal-processing units 211 receives and adjusts the acoustic signal AL and AR in their levels, delay times, and frequency properties and the like and performs any processing such as mixture of the acoustic signal AL and AR (sound field control processing). Each of the signal-processing units 211 also performs any signal compensation processing relative to output characteristics of the magnetostrictive actuator 103. Each of the HPFs 212 receives the acoustic signal from the corresponding signal-processing unit 211 and extracts high frequency components therefrom to supply it to the amplification block 202.

The amplification block 202 receives and amplifies the high frequency components of the acoustic signals on which the signal adjustment and sound field compensation sub-block 201A of the DSP block 201 has separately performed the sound control processing and the signal compensation processing to supply the magnetostrictive actuators 103 with them. The magnetostrictive actuators 103 then receive the amplified high frequency components of the acoustic signals, respectively. Thus, driving the four magnetostrictive actuators 103 by the high frequency components on which the sound control processing have been performed allows a global acoustic image to be enhanced by high frequency acoustic output.

On the other hand, the signal adjustment and sound field control sub-block 201B for speaker units includes four signal-processing units 221 and four low pass filters (LPF) 222 which are respectively corresponded to the four speaker units 104*a* through 104*d*. The signal adjustment and sound field compensation sub-block 201B also includes four pairs of (eight) attenuators 220 each pair for receiving and attenuating a left acoustic signal AL and a right acoustic signal AR that constitute a stereo acoustic signal for each of the four signal-processing units 221.

Each of the signal-processing units 221 receives and adjusts the acoustic signal AL and AR in their levels, delay times, and frequency properties and the like and performs any processing such as mixture of the acoustic signal AL and AR (sound field control processing). Each of the signal-processing units 221 also performs any signal compensation processing relative to resonator characteristics. Each of the LPFs 222 receives the acoustic signal from the corresponding signal-processing unit 221 and extracts low frequency components therefrom to supply it to the amplification block 203.

The amplification block 203 amplifies the low frequency components of the acoustic signals on which the signal adjustment and sound field compensation sub-block 201B of the DSP block 201 has separately performed the sound control processing and the signal compensation processing to supply each of the speaker units 104a through 104*d* with them. The four speaker units 104*a* through 104*d* then receive the amplified low frequency components of the acoustic signals, respectively. Thus, driving the four speaker units 104*a* through 104*d* by the low frequency components on which the sound control a processing has been performed allows a global acoustic image to be enhanced by low frequency acoustic output.

It is to be that in the driving system 200 as shown in FIG. 24, the signal-processing units 211 and the HPFs 212 can be arranged along a contrary order in the signal adjustment and sound field compensation sub-block 201A and similarly, the signal-processing units 221 and the LPFs 222 can be arranged along a contrary order in the signal adjustment and sound field compensation sub-block 201B. Although the high frequency components that drive the four magnetostrictive actuators 103 and the low frequency components that a drive the four speaker units 104*a* through 104*d* have been acquired from the right and left acoustic signals AR, AL that constitute the stereo acoustic signal in the driving system 200 shown in FIG. 24, the invention is not limited thereto. They can be acquired-from a monaural acoustic signal or a multi-channel acoustic signal.

Remaining parts of the speaker 100C shown in FIGS. 20 through 23 are similar to those of the speaker 100A shown in FIGS. 1 through 4. The speaker 100C shown in FIGS. 20 through 23 operates similar to the operations of the speaker 100A shown in FIGS. 1 through 4.

In this speaker 100C, however, the four speaker units 104*a* through 104*d* are installed on the bottom surface of the base casing 101 and driven respectively on the basis of the low frequency components SAL1 through SAL4. Accordingly, low frequency sound wave of positive phase radiated from the front side of each of the speaker units 104*a* through 104*d* radiates to outside by passing through the bottom surface of the base casing 101. Low frequency sound wave of negative phase radiated from the back side of each of the speaker units 104*a* through 104*d* radiates from an upper end of the pipe member 102 to outside by passing through the passages 143*a* through 143*d* and the passages 141*a* through 141d.

According to the speaker 100C, in addition to an excellent effect similar to that of the above speaker 100A, the following effect can be attained. Namely, in this embodiment, the four speaker units 104*a* through 104*d* are provided and they are separated by the partition wall 142 to be respectively arranged on the same axis as that of the pipe member 102C in each of the four passages 141*a* through 141*d* so that they do not intervene in each other and their independency can be obtained. Thus, as shown in FIG. 24, driving the four speaker units 104*a* through 104*d* based on the low frequency components SAL1 through SAL4 on which the signal-processing units 221 have separately performed any processing allows a sound field processing to enhance a global acoustic image to be attained.

Figure 25:
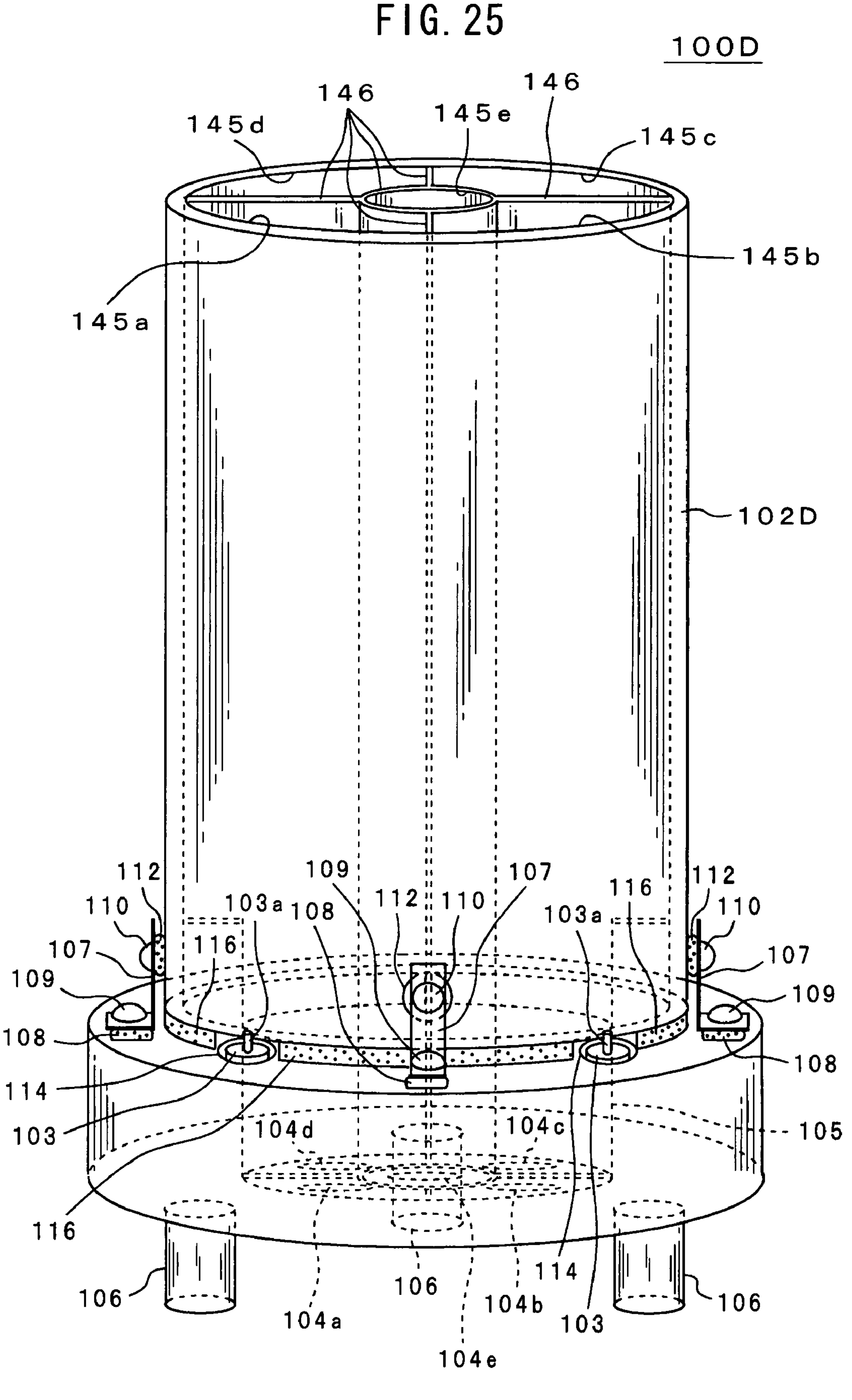
FIG. 25 is a perspective view of a speaker 100D according to an additional embodiment of the invention.
Figure 26:
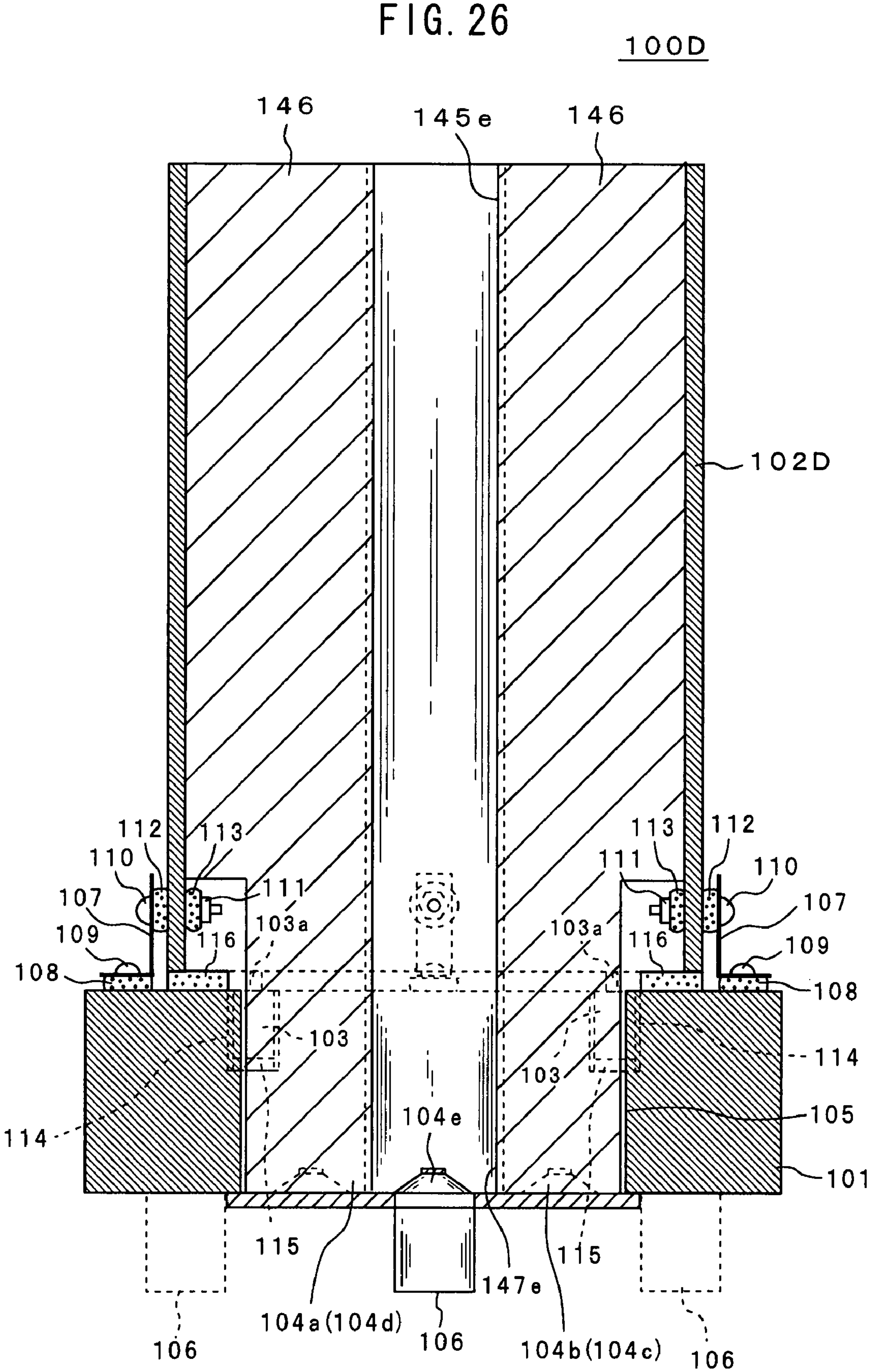
FIG. 26 is a vertical sectional view of the speaker 100D according to the above additional embodiment of the invention.
Figure 27:
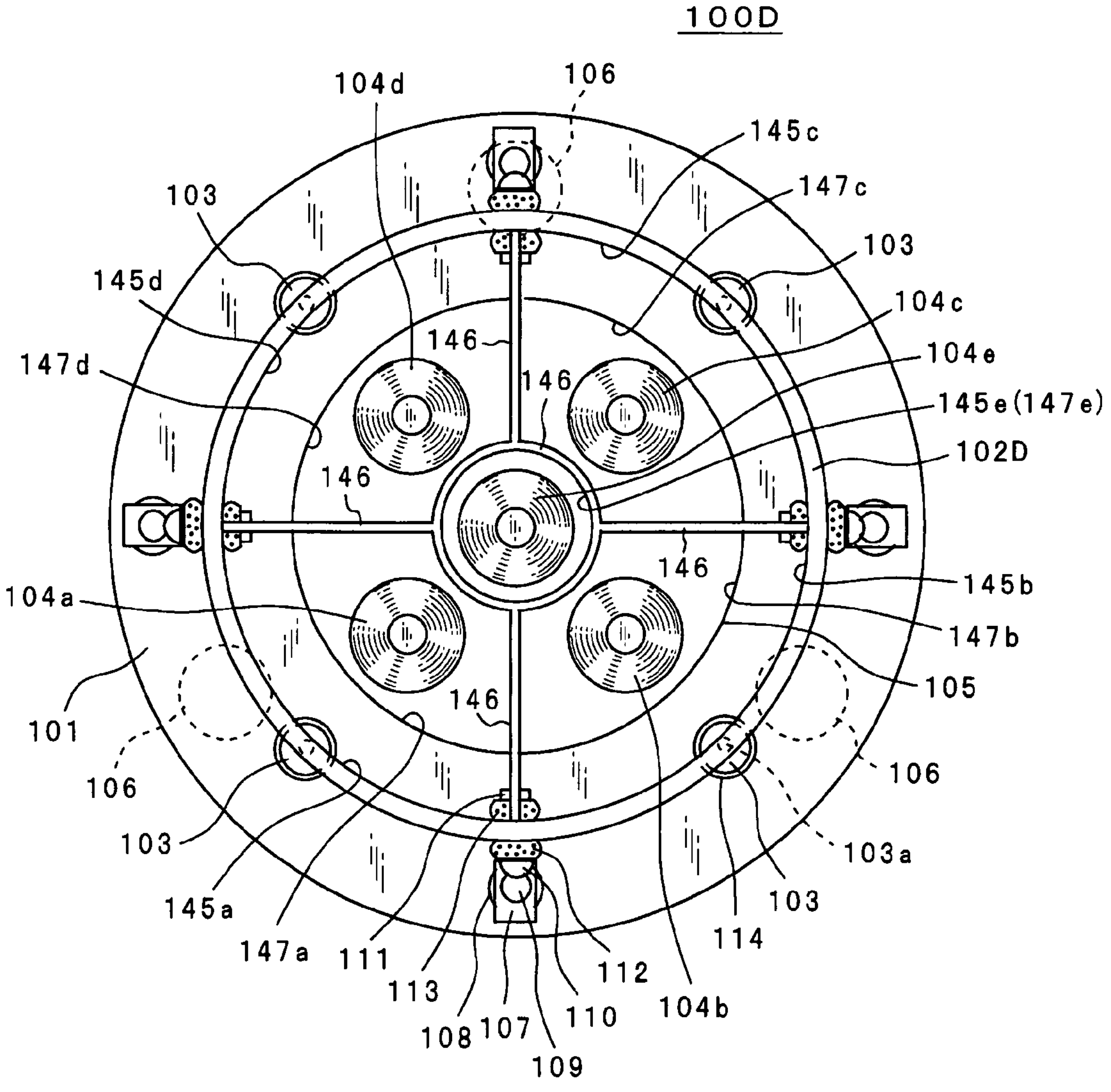
FIG. 27 is a top plan view of the speaker 100D according to the above additional embodiment of the invention.
Figure 28:
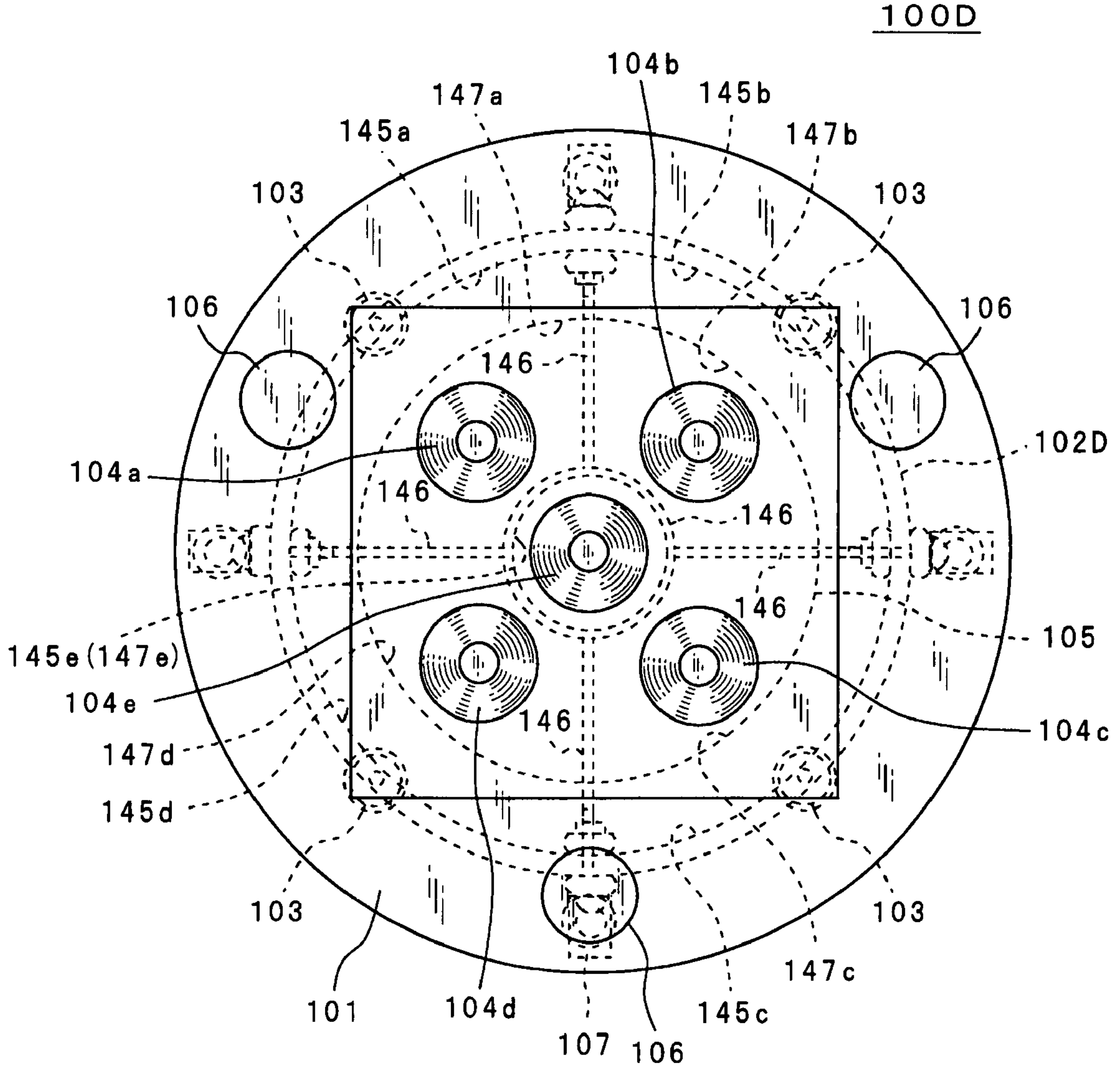
FIG. 28 is a bottom plan view of the speaker 100D according to the above additional embodiment of the invention.
Figure 29B:
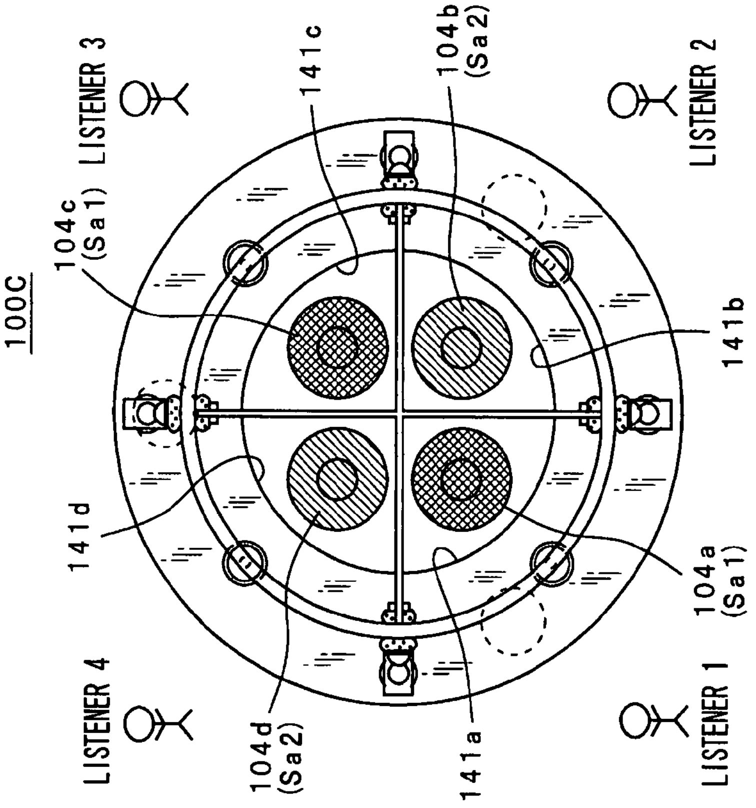
FIGS. 29A and 29B are diagrams each for comparing effects obtained by the speakers 100C and 100D.
Figure 29A:
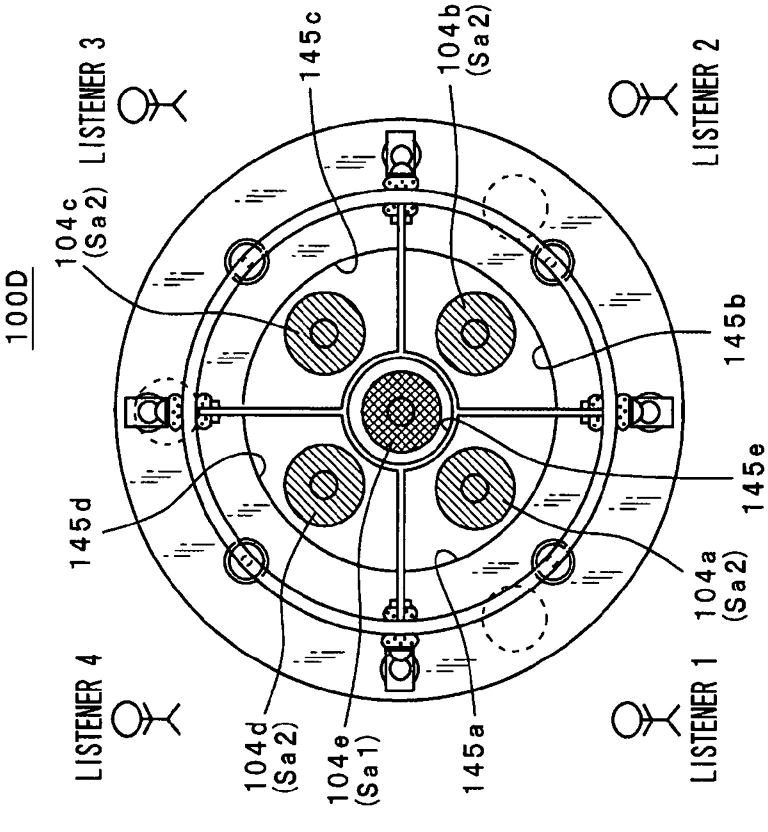

The following will describe a speaker 100D according to an additional embodiment of the invention. FIGS. 25 through 28 show a configuration of the speaker 100D according to the additional embodiment of the invention. FIG. 25 is a perspective view of the speaker 100D; FIG. 26 is a vertical sectional view thereof; FIG. 27 is a top plan view thereof; and FIG. 28 is a bottom plan view thereof. In FIGS. 25 through 28, like reference numbers refer to like elements of FIGS. 1 through 4, a detailed explanation of which will be omitted.

In this speaker 100D, an interior of the pipe member 102 is partitioned by a partition member, for example, a partition wall 146 made of acrylic resin, into plural parts to form plural passages, five passages 145*a* through 145*e* in this embodiment, each extending along an axis direction of the pipe member 102. In this embodiment, of the five passages 145*a* through 145*e*, a part thereof 145*e* is formed at a central part of the pipe member 102 and other parts 145*a* through 145*d* are formed around the passage 145*e*.

The partition wall 146 has a transversal section of circular section at its center and a radiation section radially extending from the circular portion outwardly in four directions, as shown in FIGS. 27 and 28.

The partition wall 146 extends, as shown in FIG. 26, from the interior of the pipe member 102 up to the opening 105 of the base casing 101 so that an interior of the base casing 101 can be partitioned thereby into parts to form five separated small passages 147*a* through 147*e* corresponding to the passages 145*a* through 145*e*, respectively, as shown in FIGS. 27 and 28. It is to be noted that since the pipe member 102D and the opening 105 of the base casing 101 have different a diameters, the partition wall 146 has widths corresponding to the respective diameters thereof to form a stepwise shape in its low position.

The speaker 100D has five speaker units 104*a* through 104*e* that are respectively arranged on the same axis as that of the pipe member 102D in each of the above five passages 145*a* through 145*e*. These speaker units 104*a* through 104*e* are respectively installed on the bottom surface of the base casing 101 by using screws, not shown, with their front side being put upside down and their main bodies being respectively received in the separated small passages 147*a* through 147*e* at a lower end of the base casing 101.

In this embodiment, the speaker units 104*a* through. 104*e* are arranged so that they can be put on the same axis as that of the pipe member 102D in each of the respective passages 145*a* through 145*e*. Sound wave of positive phase radiated from the front side of each of the speaker units 104*a* through 104*e* radiates to outside by passing through the bottom surface of the base casing 101. Sound wave of negative phase radiated from the back side of each of the speaker units 104*a* through 104*d* radiates from an upper end of the pipe member 102 to outside by passing through the small passages 147*a* through 147*e* and the passages 145*a* through 145*e*. In this embodiment, the pipe member 102 also acts as a resonator.

Although a driving system therefor is not shown, the five speaker units 104*a* through 104*e* are separately driven on the basis of low frequency components that are separately processed (see FIG, 24) similar to the speaker units 104*a* through 104*d* in the speaker 100C as shown in FIGS. 20 through 23.

Remaining parts of the speaker 100D shown in FIGS. 25 through 28 are similar to those of the speaker 100A shown in FIGS. 1 through 4. The speaker 100D shown in FIGS. 25 through 28 operates similar to the operations of the speaker 100A shown in FIGS. 1 through 4.

In this speaker 100D, however, the five speaker units 104*a* through 104*e* are installed on the bottom surface of the base casing 101 and driven respectively on the basis of the low frequency components. Accordingly, low frequency sound wave of positive phase radiated from the front side of each of the speaker units 104*a* through 104*e* radiates to outside by passing through the bottom surface the base casing 101. Low frequency sound wave of negative phase radiated from the back side of each of the speaker units 104*a* through 104*e* radiates from an upper end of the pipe member 102 to outside by passing through the small passages 147*a* through 147*e* and the passages 145*a* through 145*e*.

According to the speaker 100D, in addition to an excellent effect similar to that of the above speaker 100A, the following effect can be attained. Namely, in this embodiment, the five speaker units 104*a* through 104*e* are provided and they are separated by the partition wall 146 to be respectively arranged on the same axis as that of the pipe member 102D in each of the five passages 145*a* through 145*e* so that they do not intervene in each other and their independency can be obtained. Thus, driving the five speaker units 104*a* through 104*e* based on the low frequency components that are separately processed allows a sound field processing to enhance a global acoustic image to be attained.

Further, according to the speaker 100D, among the five passages 145*a* through 145*e*, the passage 145*e* is formed at a central part of the pipe member 102 and other passages 145*a* through 145*d* are formed around the passage 145*e* formed at the central part of the pipe member 102. In this case, if the speaker unit 104*e* corresponding to the central passage 145*e* is driven on the basis of an acoustic signal Sa1 and the speaker units 104*a* through 104*d* corresponding to the surrounding passages 145*a* through 145*d* are driven on the basis of an acoustic signal Sa2, it is possible to get such an effect that even sound field control effect can be attained at any positions around the pipe member 102D, namely, at a position of any listeners U1 through U4.

If no passage is formed at a central part of the pipe member 102D as the above speaker 100C when, for example, the speaker units 104*a* and 104*c* corresponding to the passages 141*a* and 141*c* are driven on the basis of an acoustic signal Sa1 and the speaker units 104*b* and 104*d* corresponding to the passages 104*b* and 104*d* are driven on the basis of an acoustic signal Sa2, uneven sound field control effect can be attained at a position around the pipe member 102. Namely, different sound field control effects can be attained at positions of listeners U1 and U3 and those of listeners U2 and U4. In other words, any sound field control effects having different directivities may be attained.

Figure 30:
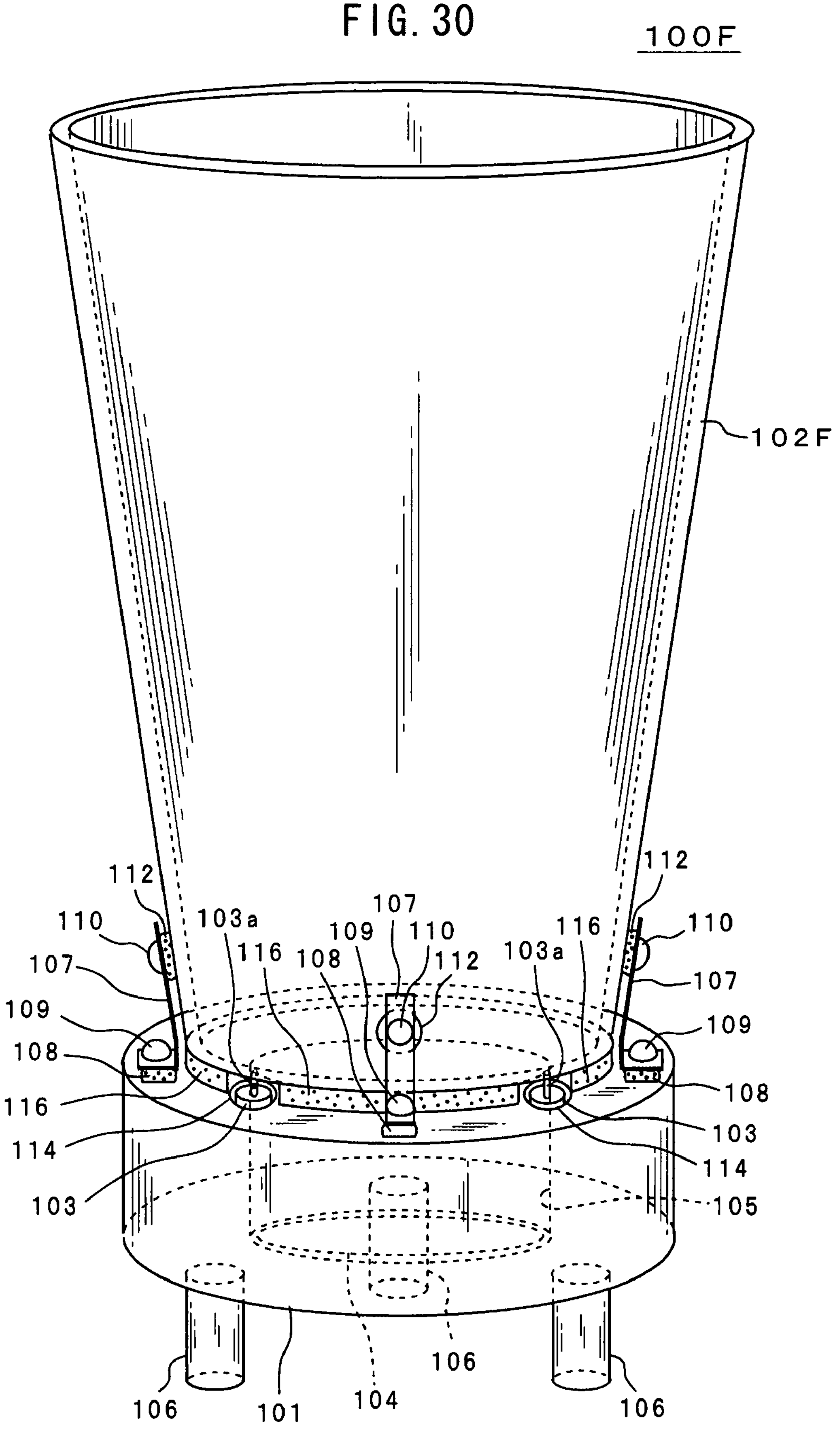
FIG. 30 is a perspective view of a speaker 100F according to a still another embodiment of the invention.

The following will describe a speaker 100F according to a still another embodiment of the invention. FIG. 30 shows a configuration of the speaker 100F according to the still another embodiment of the invention. FIG. 30 is a perspective view of the speaker 100F. In FIG. 30, like reference numbers refer to like elements of FIG. 1, a detailed explanation of which will be omitted.

In this speaker 100F, a pipe member 102F is used in place of the pipe member 102 of the speaker 100A shown in FIG. 1. The pipe member 102F has different diameters of its circular cross sections, which are gradually made larger toward a direction (upwardly in FIG. 30) where the sound wave radiated from the speaker unit 104 propagates.

Remaining parts of the speaker 100F shown in FIG. 30 are similar to those of the speaker 100A shown in FIGS. 1 through 4. The speaker 100F shown in FIG. 30 operates similar to the operations of the speaker 100A shown in FIGS. 1 through 4.

According to the speaker 100F, in addition to an excellent effect similar to that of the above speaker 100A, the following effect can be attained. Namely, since the pipe member 102F has different diameters of its circular cross sections, which are gradually made larger toward a direction where the sound wave radiated from the speaker unit 104 propagates, it can have any increased electric inductance components, thereby enabling flat frequency properties and resonance dumping effects to be gotten. Since the pipe member 102F has an enlarged opening from which the sound wave radiates, it is possible to enhance a global acoustic image.

Figure 31:
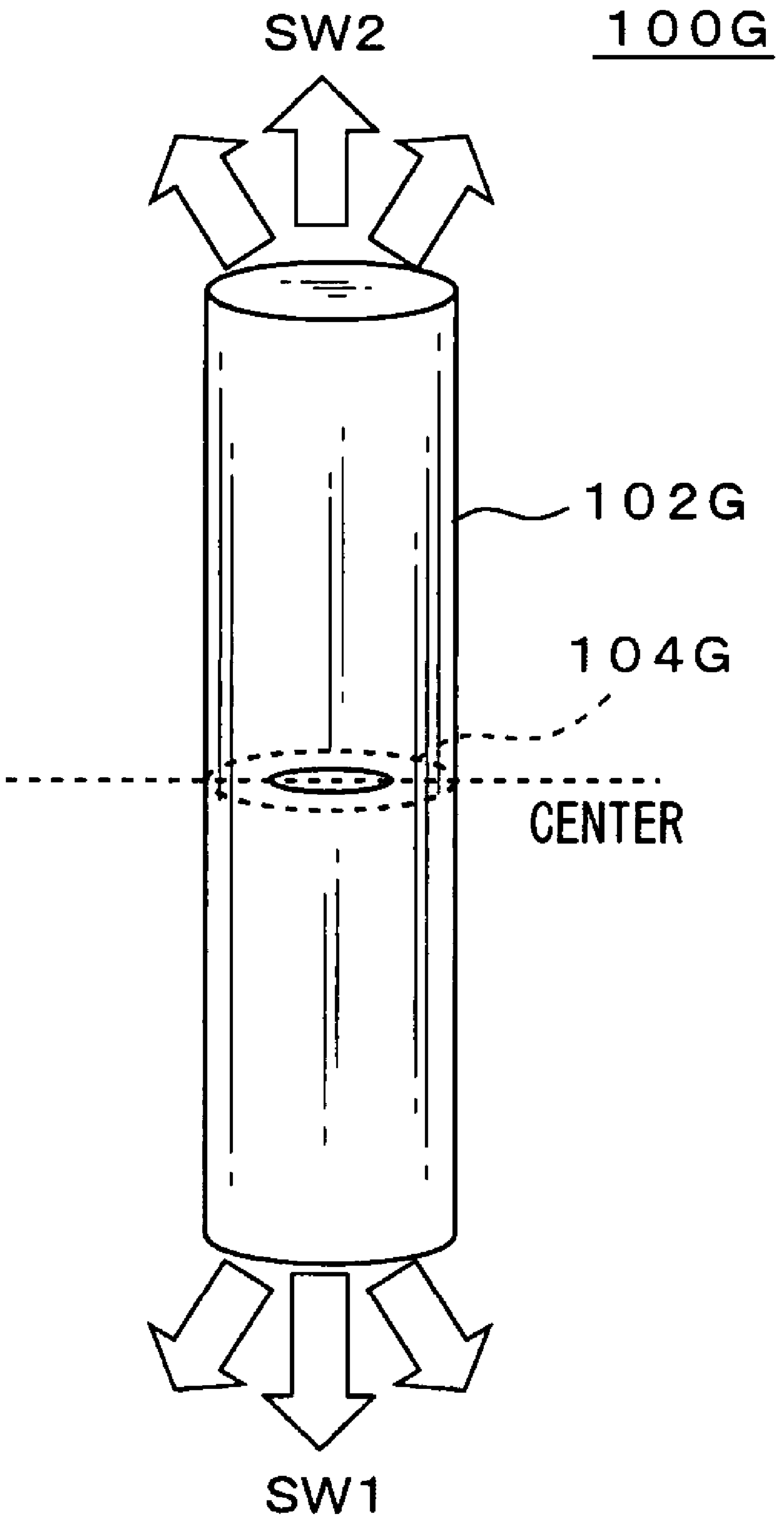
FIG. 31 is a schematic perspective view of a speaker 100G according to a still further embodiment of the invention.

Although it has described that the speaker unit(s) is (are) installed on the bottom surface of the base casing 101 in the above embodiments, the invention is not limited thereto. As a still further embodiment, a speaker 100G as shown in FIG. 31 in which a speaker unit 104G is arranged at a middle portion of the pipe member 102 in a longitudinal direction thereof can be provided.

According to the speaker 100G, sound wave SW1 of positive phase radiated from the front side of the speaker unit 104G propagates downwardly in the pipe member 102G and radiates to outside through the bottom end thereof. Sound wave SW2 of negative phase radiated from the back side of the speaker unit 104G propagated upwardly in the pipe member 102G and radiates to outside through the upper end thereof. In this embodiment, the pipe member 102G acts as a resonator.

According to the speaker 10G, sound waves radiate from both of upper and bottom ends of the pipe member 102G. This enables a listener to feel even sound pressures at each position of the pipe member 102G in its longitudinal direction, thereby allowing the listener to spread an acoustic image along a whole length of the pipe member 102G to get a global acoustic image. In this moment, the speaker unit 104G is arranged at a middle portion of the pipe member 102 in a longitudinal direction thereof so that the levels of the sound waves radiated from both of upper and bottom ends of the pipe member 102G can be made almost identical, thereby enabling more even sound pressure to be obtained at each position of the pipe member 102 in a longitudinal direction thereof.

Figure 32:
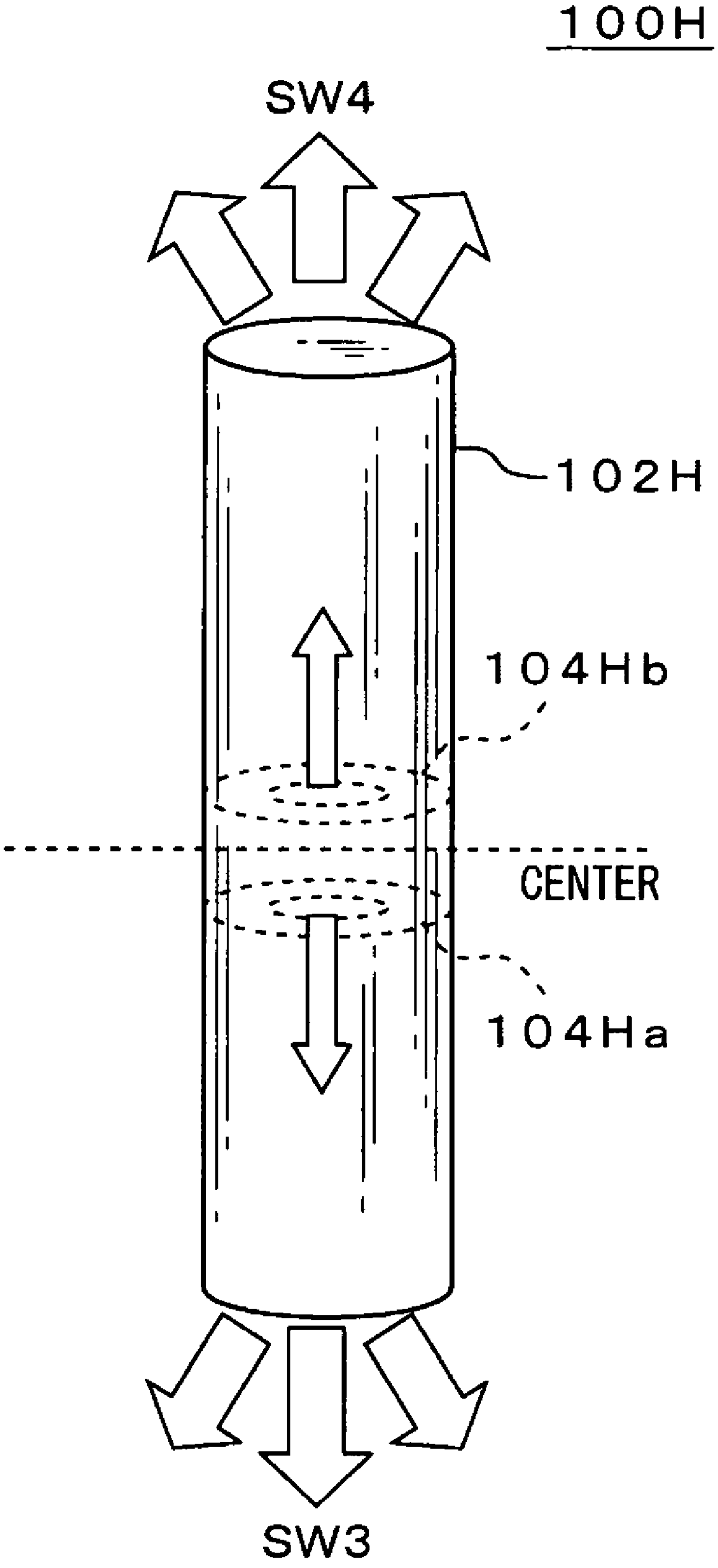
FIG. 32 is a schematic perspective view of a speaker 100H according to a still additional embodiment of the invention.

Although it has described that the sound wave of positive phase radiates to outside through the bottom end of the pipe member 102, 102B, 102C, 102D, 102F or 102G and the sound wave of negative phase radiates to outside through the upper end of the pipe member 102, 102B, 102C, 102D, 102F or 102G, in the above embodiments, the invention is not limited thereto. As a still additional embodiment, a speaker 100H as shown in FIG. 32 in which two speaker units 104Ha, 104Hb are arranged at a middle portion of the pipe member 102H in a longitudinal direction thereof can be provided. These speaker units 104Ha, 104Hb are arranged at a middle portion of the pipe member 102H with them being arranged back to back. These speaker units 104Ha, 104Hb are driven on the basis of the same acoustic signal.

According to the speaker 100H, sound wave SW3 of positive phase radiated from the front side of the speaker unit 104Ha propagates downwardly in the pipe member 102H and radiates to outside through the bottom end thereof. Sound wave SW4 of positive phase radiated from the front side of the speaker unit 104Hb propagates upwardly in the pipe member 102H and radiates to outside through an upper end thereof. In this embodiment, the pipe member 102G acts as a resonator.

According to the speaker 100H, sound waves radiate from both of upper and bottom ends of the pipe member 102H. This enables a listener to feel even sound pressures at each position of the pipe member 102H in its longitudinal direction, thereby allowing the listener to spread an acoustic image along a whole length of the pipe a member 102H to get a global acoustic image.

In this moment, the speaker units 104Ha, 104Hb are arranged at a middle portion of the pipe member 102H in a longitudinal direction thereof so that the levels of the sound waves radiated from both of upper and bottom ends of the pipe member 102H can be made almost identical, thereby enabling more even sound pressure to be obtained at each position of the pipe member 102 in a longitudinal direction thereof. Further, the sound waves radiated from the upper and bottom ends of the pipe member 102H has the identical phase so that the same characteristic can be gotten at both of the upper and bottom ends of the pipe member 102H, thereby allowing the listener to feel an acoustic mage having no difference in the characteristics.

Although in the above embodiments, the magnetostrictive actuator and the electrodynamic actuator have been used as the sounding body (transducer) in the speaker unit, this invention is not limited thereto. Of course, a piezoelectric actuator or the like may be used as the sounding body.

According to the above embodiments of the invention, it is possible to obtain a global acoustic image within an acceptable wide range so that this invention is applicable to a speaker or the like that is available for the audio-visual equipment.

It should be understood by those skilled in the art that various modifications, combinations, sub-combinations and alternations may occur depending on design requirements and other factors insofar as they are within the scope of the appended claims or the equivalents thereof.

What is claimed is:

1. A speaker, comprising:

a disk-shaped base casing with a cylindrical opening;

a pipe mounted on the base casing;

a plurality of actuators mounted on the base casing and attached to the pipe; and a speaker unit installed in the cylindrical opening of the base casing, wherein the plurality of actuators and the pipe constitute a high frequency sounding component that acts as a tweeter, the pipe being a diaphragm to produce high frequency sound, and wherein the speaker unit and the pipe constitute a low frequency sounding component that acts as a woofer, the pipe being a resonator which improves the low frequency sound produced by the speaker unit.

2. The speaker according to claim 1, further comprising a plurality of speaker units, wherein the interior of the pipe and the cylindrical opening of the base casing are partitioned into a plurality of passages extending along the axis of the pipe, and wherein each passage contains one of the plurality of speaker units in the partitioned cylindrical opening.

3. The speaker according to claim 2, wherein one of the plurality of passages is formed as a central passage and other passages are formed around the central passage.

4. The speaker according to claim 1, wherein the speaker unit of the low frequency sounding component is arranged at a middle portion of the pipe.

5. The speaker according to claim 1, wherein the pipe tapers gradually towards one end.

6. The speaker according to claim 1, wherein the low frequency sounding component includes a first speaker unit and a second speaker unit, located back to back at a middle portion of the pipe, and wherein sound produced by the first speaker unit radiates outside through one end of the pipe and sound produced by the second speaker unit radiates outside through the other end of the pipe.

7. A method of reproducing and outputting acoustic sound with a high frequency sounding component and a low frequency sounding component, the method comprising:

producing the high frequency sounding component with a pipe and a plurality of actuators mounted on a base casing and attached to the pipe, the pipe being a diaphragm; and producing the low frequency sounding component with a speaker unit, the pipe being a resonator which improves the sound produced by the speaker unit.

* * * * *